US010037897B2

(12) United States Patent
Kuo et al.

(10) Patent No.: US 10,037,897 B2
(45) Date of Patent: Jul. 31, 2018

(54) INTER-FAN-OUT WAFER LEVEL PACKAGING WITH COAXIAL TIV FOR 3D IC LOW-NOISE PACKAGING

(71) Applicant: TAIWAN SEMICONDUCTOR MANUFACTURING CO., LTD., Hsin-Chu (TW)

(72) Inventors: Feng-Wei Kuo, Zhudong Township (TW); Wen-Shiang Liao, Toufen Town (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/431,909

(22) Filed: Feb. 14, 2017

(65) Prior Publication Data
US 2018/0151389 A1 May 31, 2018

Related U.S. Application Data

(60) Provisional application No. 62/427,465, filed on Nov. 29, 2016.

(51) Int. Cl.
| H01L 23/00 | (2006.01) |
| H01L 21/48 | (2006.01) |
| H01L 23/498 | (2006.01) |
| H01L 25/065 | (2006.01) |
| H01L 23/522 | (2006.01) |
| H01L 23/532 | (2006.01) |
(Continued)

(52) U.S. Cl.
CPC .......... *H01L 21/486* (2013.01); *H01L 21/481* (2013.01); *H01L 21/4853* (2013.01);
(Continued)

(58) Field of Classification Search
CPC ....... H01L 2224/97; H01L 2924/01029; H01L 24/97; H01L 2224/45147; H01L 23/49827;
(Continued)

(56) References Cited

U.S. PATENT DOCUMENTS 8,320,134 B2 * 11/2012 Su ..................... H01L 23/49827
174/262
8,448,100 B1 5/2013 Lin et al.
(Continued)

OTHER PUBLICATIONS

U.S. Appl. No. 15/076,976, filed Mar. 22, 2016.

*Primary Examiner* — Ngan Ngo
(74) *Attorney, Agent, or Firm* — Duane Morris LLP

(57) ABSTRACT

A semiconductor package includes a first semiconductor element, an insulating layer, and a second semiconductor element. The first semiconductor element includes at least one conductive layer and at least one via layer. The insulating layer is positioned above the first semiconductor device and includes at least one through insulator via (TIV) extending from a first side of the insulating layer to a second side of the insulating layer. The at least one TIV has a conductive core including a copper-containing material. The second semiconductor element is positioned above the insulating layer and includes at least one conductive layer and at least one via layer. The at least one TIV couples the at least one via layer of the first semiconductor element to the at least one via layer of the second semiconductor element.

19 Claims, 23 Drawing Sheets

(51) Int. Cl.
*H01L 23/552* (2006.01)
*H01L 25/00* (2006.01)

(52) U.S. Cl.
CPC .... *H01L 21/4857* (2013.01); *H01L 23/49822* (2013.01); *H01L 23/49827* (2013.01); *H01L 23/49838* (2013.01); *H01L 23/49866* (2013.01); *H01L 23/49894* (2013.01); *H01L 23/5225* (2013.01); *H01L 23/53228* (2013.01); *H01L 23/552* (2013.01); *H01L 24/02* (2013.01); *H01L 24/97* (2013.01); *H01L 25/0652* (2013.01); *H01L 25/0655* (2013.01); *H01L 25/0657* (2013.01); *H01L 25/50* (2013.01); *H01L 2224/02333* (2013.01); *H01L 2224/02381* (2013.01); *H01L 2224/45147* (2013.01); *H01L 2224/48145* (2013.01); *H01L 2224/97* (2013.01); *H01L 2225/06548* (2013.01); *H01L 2225/06572* (2013.01); *H01L 2225/1041* (2013.01); *H01L 2924/01029* (2013.01)

(58) Field of Classification Search
CPC ... H01L 2225/1041; H01L 2224/48145; H01L 25/0657
See application file for complete search history.

(56) References Cited

U.S. PATENT DOCUMENTS

| | | | |
|---|---|---|---|
| 8,631,372 B2 | 1/2014 | Yu et al. | |
| 8,669,780 B2 | 3/2014 | Chi | |
| 8,701,073 B1 | 4/2014 | Fu et al. | |
| 8,754,818 B2 | 6/2014 | Yen et al. | |
| 8,896,094 B2 | 11/2014 | Yen et al. | |
| 8,941,222 B2 * | 1/2015 | Hunt | H01L 21/565 257/678 |
| 9,016,939 B2 | 4/2015 | Chang et al. | |
| 9,086,452 B2 | 7/2015 | Wang et al. | |
| 9,165,968 B2 | 10/2015 | Chao et al. | |
| 9,171,798 B2 | 10/2015 | Lin et al. | |
| 9,172,242 B2 | 10/2015 | Chang et al. | |
| 9,219,038 B2 | 12/2015 | Horng et al. | |
| 2008/0224276 A1* | 9/2008 | Yang | H01L 23/3677 257/659 |
| 2008/0258293 A1* | 10/2008 | Yang | H01L 23/3677 257/701 |
| 2013/0134553 A1* | 5/2013 | Kuo | H01L 23/552 257/532 |
| 2013/0193981 A1 | 8/2013 | Chen et al. | |
| 2013/0246990 A1 | 9/2013 | Yen et al. | |
| 2013/0320553 A1 | 12/2013 | Kuo et al. | |
| 2014/0126274 A1 | 5/2014 | Lee et al. | |
| 2014/0167799 A1 | 6/2014 | Wang et al. | |
| 2014/0195728 A1 | 7/2014 | Hsu et al. | |
| 2014/0239427 A1 | 8/2014 | Huang et al. | |
| 2014/0266273 A1 | 9/2014 | Wang et al. | |
| 2016/0035678 A1* | 2/2016 | Yoo | H01L 23/552 257/659 |
| 2016/0365324 A1* | 12/2016 | Kim | H01L 21/486 |
| 2017/0162492 A1* | 6/2017 | Hsu | H01L 23/49827 |
| 2017/0181280 A1* | 6/2017 | Asano | H05K 1/115 |

* cited by examiner

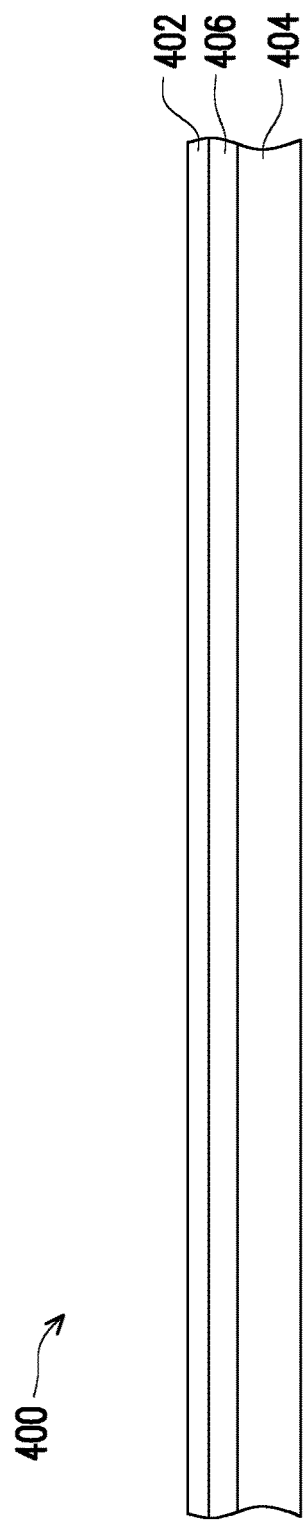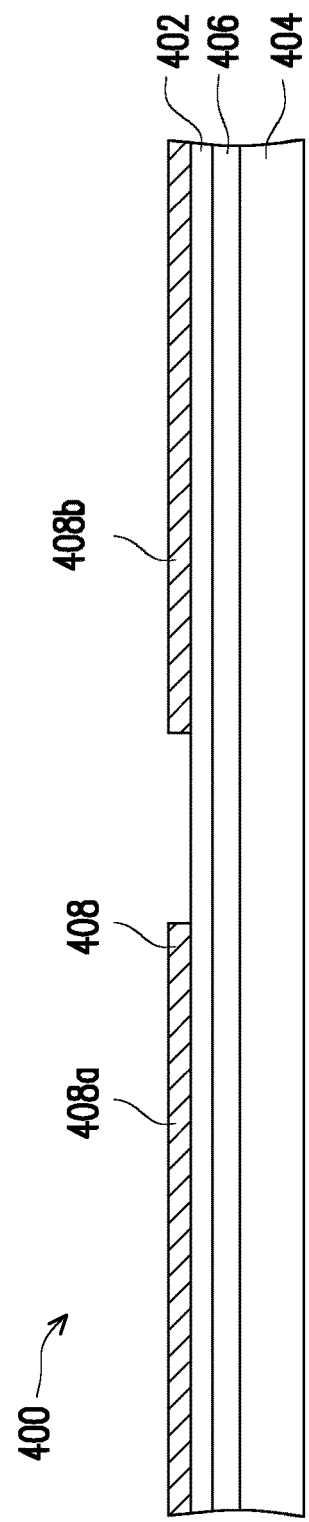
FIG. 5
FIG. 6

US 10,037,897 B2

INTER-FAN-OUT WAFER LEVEL PACKAGING WITH COAXIAL TIV FOR 3D IC LOW-NOISE PACKAGING

CROSS-REFERENCE TO RELATED APPLICATION

This application claims benefit to U.S. Provisional Appl. Ser. No. 62/427,465, filed on Nov. 29, 2016, and entitled "INTER-FAN-OUT WAFER LEVEL PACKAGING WITH COAXIAL TIV FOR 3D IC LOW-NOISE PACKAGING," the disclosure of which is incorporated by reference in its entirety.

BACKGROUND

Integrated circuits ("ICs") are incorporated into many electronic devices. IC packaging allows for multiple ICs to be vertically stacked in "three-dimensional (3D)" packages in order to save horizontal area on printed circuit boards ("PCBs"). An alternative packaging technique, referred to as 2.5D packaging, may use an interposer, which may be formed from a semiconductor material such as silicon, for coupling one or more semiconductor die to a PCB. A plurality of IC or other semiconductor dies, which may be heterogeneous technologies, may be mounted on the interposer.

Many devices on one or more of the semiconductor die may cause electrical noise and/or create electromagnetic ("EM") interference by emitting EM emissions. RF devices and inductors are examples of devices which can create electrical noise and EM interference. A noisy source, such as an RF device, generates electrical noise in signals carried in conductive structures such as metal leads. The electrical noise in the conductive leads can impact various other signals and devices in the package. Noisy electrical signals present serious problems in semiconductor packaging.

BRIEF DESCRIPTION OF THE DRAWINGS

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion.

FIG. 5 illustrates a partial semiconductor package having a first buffer layer and a light-to-heat conversion (LTHC) layer formed over a carrier substrate, in accordance with some embodiments.

FIG. 6 illustrates the partial semiconductor package of FIG. 5 having a first metal layer deposited thereon, in accordance with some embodiments.

DETAILED DESCRIPTION

Figure 1:
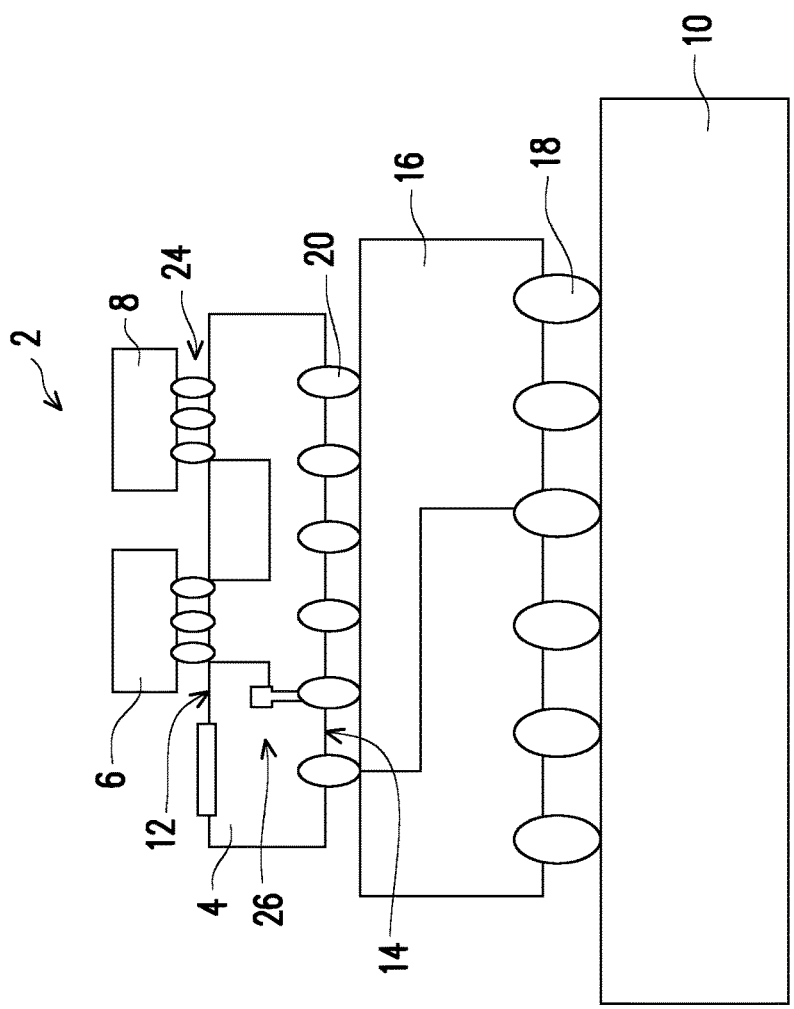
FIG. 1 illustrates a side view of a 2.5D semiconductor package including an interposer, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

In various embodiments, a semiconductor package includes at least one through insulator via (TIV) coupling a first metal layer and a second metal layer. The semiconductor package includes a first semiconductor package element and a second semiconductor package element. Each of the semiconductor packages includes a plurality of conductive metal layers and a plurality of via layers coupling conductive lines in each of the plurality of conductive metal layers. A plurality of semiconductor dies are disposed in the insulating layer positioned between the first and second semiconductor packages. A plurality of TIVs extend through the insulating layer and couple a first metal layer of the first semiconductor package and a first metal layer of the second semiconductor package. In some embodiments, the TIVs include an inner conductive core, an insulating layer, and an outer conductive shielding layer. The inner conductive core includes a copper and/or copper-alloy.

FIG. 1 illustrates a side view of a semiconductor package 2 having an interposer 4 disposed between a substrate and one or more semiconductor dies (known as a 2.5D semiconductor package), according to some embodiments. In the 2.5D semiconductor package shown in FIG. 1, an interposer 4 is disposed under first and second semiconductor dies 6, 8 and above a package substrate 16. In some embodiments, the interposer 4 comprises base substrate (such as, for example, silicon) having one or more passive devices formed thereon and a plurality of through-silicon vias (TSVs). The interposer 4 couples electrical connections of the semiconductor dies 6, 8 to a package substrate 16 and/or a printed circuit board 10. In some embodiments, the interposer does not contain any active devices. In some embodiments, the semiconductor package 2 can include integrated fan-out wafer level packaging (InFO-WLP). The semiconductor dies 6, 8 are coupled to the first surface 12 of the interposer 4. A second surface 14, opposite the first surface 12, of the interposer 4 is directly coupled to a package substrate 16.

In some embodiments, the semiconductor dies 6, 8 comprise one or more active devices. For example, in some embodiments, the semiconductor dies 6, 8 can include a GPS die, a GPS baseband die, a processor (such as an ARM processor) and/or any other suitable active device. The package substrate 16 can comprise any suitable substrate, such as, for example, a ceramic material, and supports one or more electrical connections between the interposer 4 and a PCB 10. The PCB 10 mechanically supports and electrically interconnects two or more IC packages 2 using one or more conductive tracks, pads, and/or other features formed from conductive layers formed on a non-conductive substrate.

The package substrate 16 is joined to PCB 10 by solder balls 18 and to interposer 4 by solder balls 20. Solder balls 24 join the interposer 4 to the first and second semiconductor dies 6, 8. Solder balls are referred to broadly as such, but need not be completely "ball shaped" as in the illustrated embodiment. Solder balls are alternatively referred to as solder bumps and take on various shapes in various embodiments. Solder balls physically join the respective components together and electrically couple electronic features of the respective components together. In some embodiments, one or more of the interposer 4, the semiconductor dies 6, 8, the PCB 10, and/or the package substrate 16 include one or more ground shielded transmission paths 26, discussed in further detail below.

Figure 2:
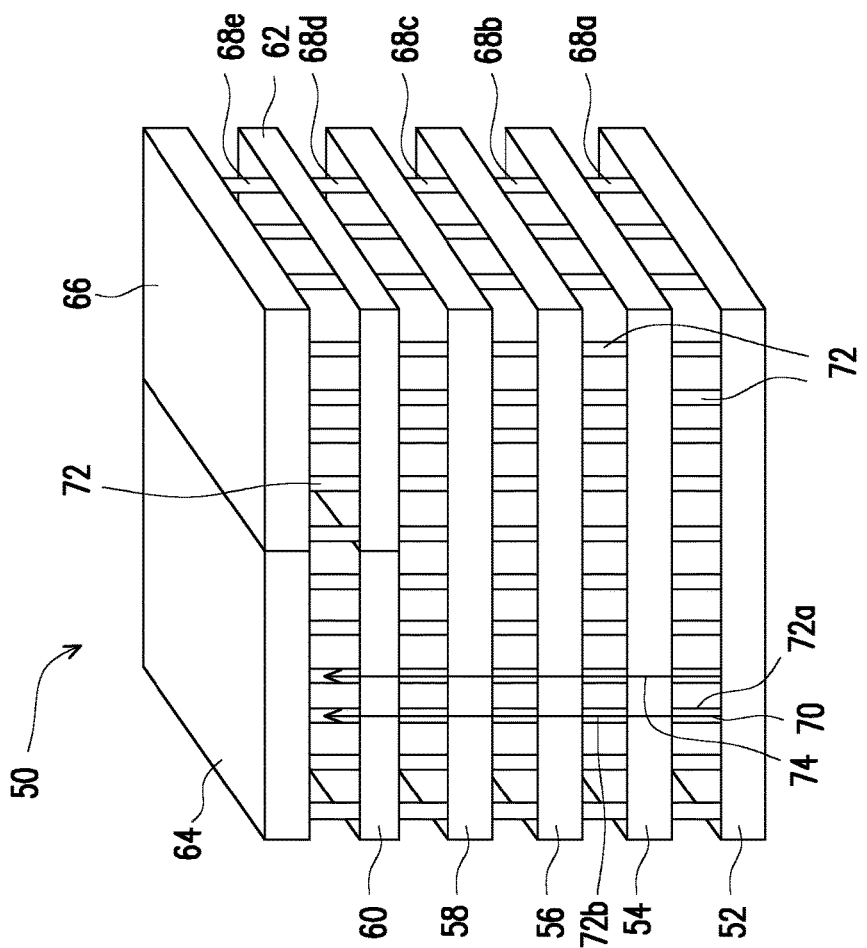
FIG. 2 illustrates a side view of a three-dimensional (3D) semiconductor package, in accordance with some embodiments.

FIG. 2 illustrates a three-dimensional (3D) semiconductor package 50, in accordance with some embodiments. In 3D semiconductor packages as shown in FIG. 2, a plurality of semiconductor dies are stacked on top of each other and include one or more through-silicon vias (TSVs) 70 to allow one or more upper die to communicate with one or more of the lower die. The 3D semiconductor package 50 includes a plurality of semiconductor dies, such as, a CPU 52, a cache memory 54, a Dynamic random-access memory (DRAM)/Non-volatile memory (NVM) 56, an analog device 58, a radiofrequency device 60, a power source 62, one or more sensors 64, and/or one or more input/output (I/O) connections 66. A plurality of through insulator via (TIV) layers 68a-68e having a plurality of TIVs 72 therein couple the plurality of semiconductor dies. Each of the semiconductor dies may include one or more through-substrate vias (TSVs) 74. In some embodiments, one or more TSVs 74 couple a first TIV 72a formed beneath a semiconductor die 54 to a second TIV 72b formed above the semiconductor die 54. In other embodiments, one or more metal layers and/or vias inside of the semiconductor die can couple a first TIV 72a to a second TIV 72b. Although a specific 3D semiconductor package 50 is discussed herein, it will be appreciated that 3D semiconductor package can include one or more additional dies, one or more fewer dies, one or more alternative dies, and/or one or more 2.5D or 2D semiconductor arrangements therein. In some embodiments, a ground-shielded transmission path includes one or more TIVs and/or one or more TSVs extending through one or more semiconductor dies.

Figure 3:
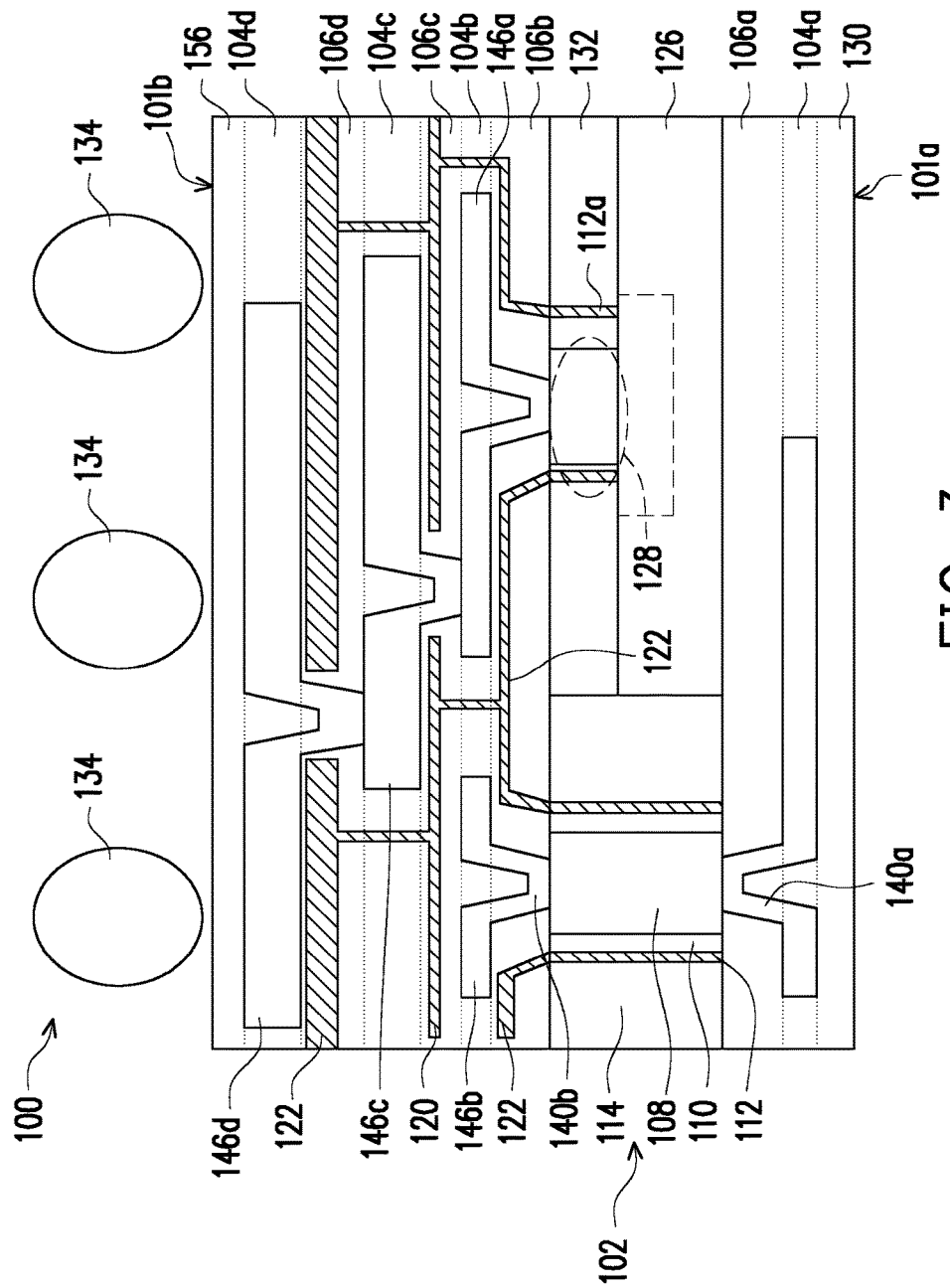
FIG. 3 illustrates a 2.5D semiconductor package including an interposer having ground shielded transmission path, according to some embodiments.

FIG. 3 illustrates a semiconductor package 100 including a ground shielded transmission path 102 coupling a first semiconductor package element 101a and a second semiconductor package element 101b, according to some embodiments. The first semiconductor package element 101a includes at least one metal layer 104a, at least one via layer 106a, and a cap layer 130. In some embodiments, the first semiconductor package element 101a can comprise any suitable material, such as, for example, silicon. The second semiconductor package element 101b includes a plurality of metal layers 104b-104d, a plurality of via layers 106b-106d, and a cap layer 130. For example, in some embodiments, the second semiconductor package element 101b can be a package substrate, such as the package substrate 16 discussed in conjunction with FIG. 1. In some embodiments, at least one semiconductor die 132 including an active device 128 is coupled to the second semiconductor element 101b. An insulating region 126 is disposed between the active device 128 and the first semiconductor package element 101a. In some embodiments, the insulating region 126 includes a silicon material, in accordance with some embodiments. The insulating region 126 can be part of an interposer and/or part of an insulating layer 114 (e.g., a packaging layer) located between the semiconductor die 132 and the first semiconductor package element 101a.

A ground shielded transmission path 102 extends through the insulating region 126 between the first semiconductor package element 101a and the second semiconductor package element 101b. In some embodiments, the ground shielded transmission path 102 extends through an interposer, for example, using a TSV formed in the interposer (not shown). A through-insulator via (TIV) 108 extends through the insulating layer 114 and couples a first via 140a formed in the first via layer 106a of the first semiconductor package element 101a to a second via 140b formed in the first via layer 106b of the second semiconductor package element 101b. The TIV 108 includes a conductive material configured to transmit a signal from the first via 140a to the second via 140b. In some embodiments, the TIV 108 has a cylindrical shape extending along a longitudinal axis. Although a single TIV is illustrated, it will be appreciated that the semiconductor package 100 can include any number of TIVs extending through the insulating layer 114, and is within the scope of this disclosure.

In some embodiments, the ground shielded transmission path 102 includes an insulating layer 110 disposed around an outer surface of the TIV 108 extending from a first via layer 106a to a second via layer 106b. The insulating layer 110 does not extend over a top surface or a bottom surface of the TIV 108. The insulating layer 110 includes an insulating material, such as, for example, a polyimide material. In some embodiments, the insulating layer 110 extends circumferentially about the longitudinal length of the TIV 108.

In some embodiments, the ground shielded transmission path 102 includes a ground shielding layer 112 disposed over and/or around an outer surface of the insulating layer 110 and the TIV 108 and extending from the first semiconductor package element 101a to the second semiconductor package element 101b. The ground shielding layer 112 includes a conductive material coupled to ground. The ground shielding layer 112 is electrically isolated from the TIV 108 by the insulating layer 110. The ground shielding layer 112 isolates the TIV 108 from radiation signals generated by one or more active devices 128 and/or prevents radiation signal transmission to/from the TIV 108. For example, when a radiation signal is generated near the TIV 108, the radiation signal encounters the ground shielding layer 112 before reaching the TIV 108. The ground shielding layer 112 drives the radiation signal to ground, dissipating energy in the radiation signal, and preventing inducement of a signal within the TIV 108 caused by the radiation signal. By preventing transmission of radiation signals into the TIV 108, the ground shielding layer 112 reduces or eliminates radiation induced noise in the TIV 108. Similarly, by preventing transmission of radiation signals from the TIV 108, the ground shielding layer 112 reduces or eliminates radiation induced noise caused by the TIV 108 and isolates a transmitted signal within the TIV 108. The ground shielding layer 112 is coupled to a ground, such as, for example, a ground formed in a PCB 10 coupled to the semiconductor package 100. In some embodiments, the insulating layer 114 insulates the ground shielding layer 112 from surrounding package elements and/or additional TIVs formed in the insulating layer 114.

In some embodiments, the ground shielding layer 112 fully encircles the sides of the TIV 108. In other embodiments, the ground shielding layer 112 is disposed in layers above and below one or more metal layers 104b-104d to limit radiation transmission between the metal layers 104b-104d. For example, in the illustrated embodiment, a continuous ground shielding layer 120 formed in a second semiconductor package element 101b. The continuous ground shielding layer 120 includes a conductive metal material 122 disposed within and between each of the via layers 106b-106d and/or the metal layers 104b-104d of the semiconductor package element 101b. In some embodiments, the conductive metal material 122 extends through the metal layers 104b-104d of the second semiconductor package element 101b in a generally vertical direction and extends through the via layers 106b-106d in a generally horizontal direction, although it will be appreciated that the conductive metal material 122 can extend in any direction within any of the layers of the semiconductor package element 101b. In some embodiments, the continuous ground shielding layer 120 and the conductive metal material 122 isolates each of the metal layers 104b-104d except where vias 140b-140d couple the metal layers 104b-104d. The continuous ground shielding layer 120 is coupled to ground through one or more package elements, such as, for example, a PCB (not shown). The continuous ground shielding layer 120 prevents transmission of radiation signals between metal layers 104b-104d of the second semiconductor package element 101b.

In some embodiments, the continuous ground shielding layer 120 is coupled to the ground shielding layer 112 of the ground shielded transmission path 102 and/or the ground shielding layer 112a. The continuous ground shielding layer 120 and the ground shielding layers 112, 112a are configured to insulate transmission paths, such as the transmission paths 146a-146d formed in the metal layers 104b-104d and the TIV 108, active devices, such as the active semiconductor device 128, and/or other portions of the semiconductor package 100 from one or more radiation signals generated by within the semiconductor package 100, such as, for example, generated by the active semiconductor device 128 and/or transmission of a signal through the signal paths 146a-146d. For example, in some embodiments, a grounded conductive metal material 122 disposed in a first via layer 106b and the second via layer 106c of the second semiconductor package element 101b isolates a first metal layer 104b from radiation signals. Similarly, a grounded conductive metal material 122 disposed in the second via layer 106c and the third via layer 106d isolates a second metal layer 104c from radiation signals.

In some embodiments, a ground shielding layer 112a is disposed about an active semiconductor device 128 coupled to the semiconductor package element 101b. The ground shielding layer 112a isolates the semiconductor device 128 from transmitting and/or receiving radiation signals. For example, in some embodiments, the active semiconductor device 128 is an RF emitting device. A ground shielding layer 112a is disposed about the RF emitting device to prevent RF signal transmission from the device interfering with other elements of the semiconductor package 100, such as, for example, a TIV 108. The ground shielding layer 112a can be coupled to a ground through one or more package elements, such as, for example, a PCB (not shown). The device 128 can include any suitable active semiconductor device that generates and/or is sensitive to receiving radiation transmissions. Additional embodiments of a semiconductor package including one or more TIVs is disclosed in U.S. patent application Ser. No. 15/076,976, filed Mar. 22, 2016, entitled "COAXIAL THROUGH VIA WITH NOVEL HIGH ISOLATION CROSS COUPLING METHOD FOR 3D INTEGRATED CIRCUITS," which is incorporated by reference herein in its entirety.

In some embodiments, the TIV 108 includes a conductive material having a relatively shorter interconnect length and time delay as compared to traditional via connections. For example, the TIV 108 can include copper (Cu) and/or a copper-based alloy. In some embodiments, a portion of the ground shielding layer 112 of the TIV 108 is formed of the same copper and/or copper-based alloy.

In some embodiments, a plurality of solder bumps 134 are coupled to metal contacts formed in a UBM layer 156. In some embodiments, one or more surface mount device (SMD) contacts are coupled to a metal contact formed in the under bump metallurgy (UBM) layer 156 (not shown). The solder bumps 134 and/or the SMD contacts are configured to couple the semiconductor package 100 to one or more additional circuit elements, such as a circuit board, using surface-mount technology.

Figure 4:
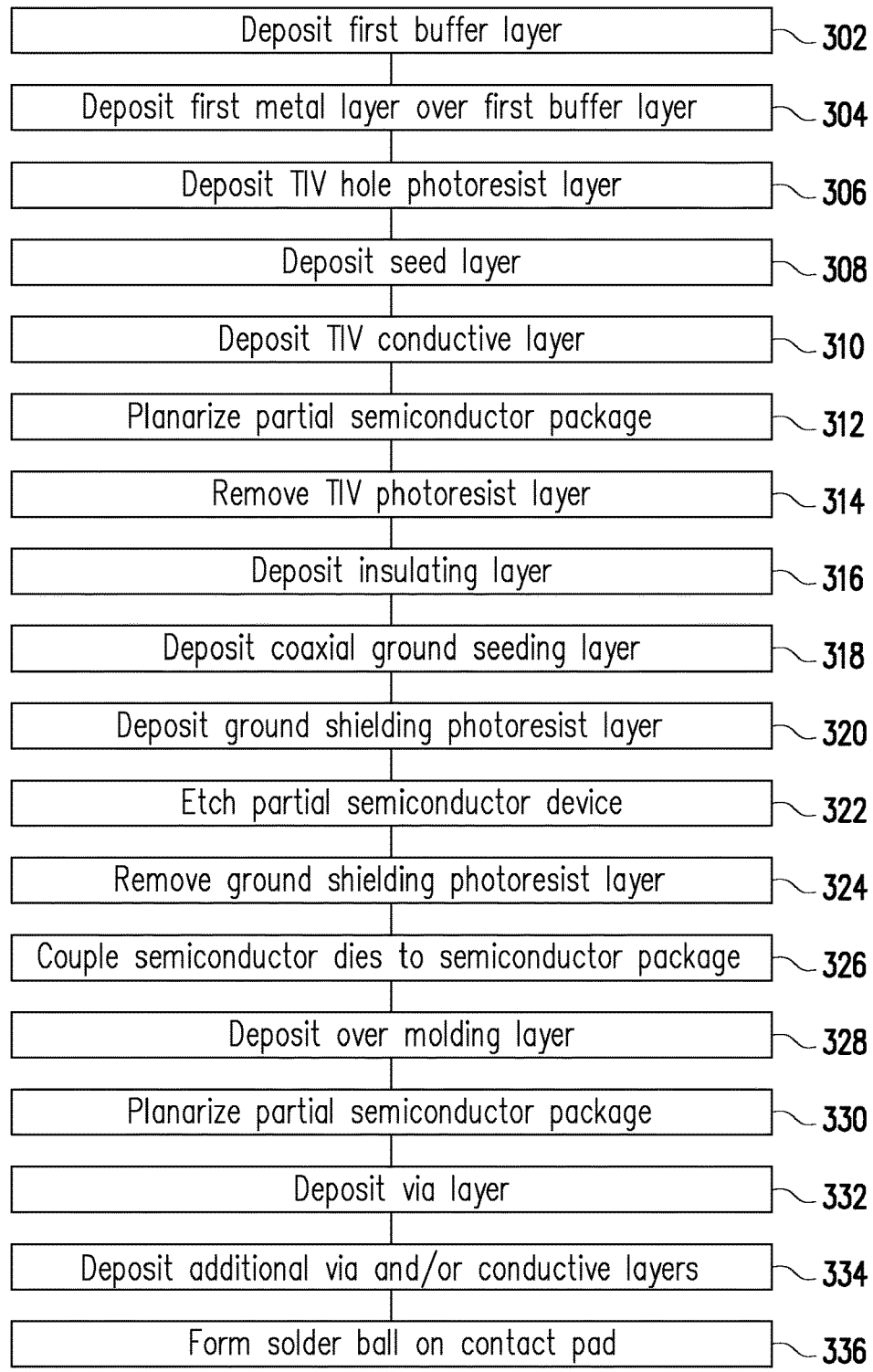
FIG. 4 is a flow chart illustrating a method of forming a semiconductor package including one or more TIV-Cu connections, in accordance with some embodiments.

FIG. 4 is a flow chart illustrating a method 300 of forming a semiconductor package 400 (FIGS. 5-24), in accordance with some embodiments. FIGS. 5-23 illustrate cross-sectional views of the semiconductor package 400 during fabrication, in accordance with some embodiments. At operation 302, a first buffer layer 402 is deposited over a carrier substrate 404, as shown in FIG. 5. The first buffer layer 402 can include any suitable material, such as, for example, a polyimide, polybenzoxazole (PBO), and/or any other suitable material. The carrier substrate 404 is a rigid material configured to support the semiconductor package 400 during formation. For example, in some embodiments, the carrier substrate 404 includes a glass and/or other inert material configured to support the semiconductor package 400 during formation without interacting with any elements of the semiconductor package 400.

In some embodiments, a light-to-heat conversion (LTHC) release layer 406 is formed between the substrate carrier 404 and the first buffer layer 402. The LTHC release layer 406 is configured to release the semiconductor package 400 from the carrier substrate 404 after the semiconductor package 400 is fully and/or partially formed. For example, in some embodiments, a laser and/or other concentrated light source is applied to the LTHC release layer 406, causing heating of the LTHC release layer 406 and separation of the semiconductor package 400 from the carrier substrate 404.

At operation 304, a first metal or copper redistribution layer 408 (Cu RDL, referred to herein as a first metal layer) is formed over at least a portion of the first buffer layer 402. As shown in FIG. 6, the first metal layer 408 can include a plurality of metal traces 408a, 408b separated by one or more gaps. For example, in some embodiments, the first metal layer 408 can be deposited by a photomask defining the one or more metal traces 408a, 408b, although it will be appreciated that the first metal layer 408 can be deposited as a solid layer and portions removed using one or more etching processes and/or one or more masks. The first metal layer 408 can be deposited to any suitable depth, such as, for example, 5 microns, 6 microns, 7 microns, 8 microns, 9 microns, and/or any other suitable depth greater than 9 microns or less than 5 microns. In some embodiments, the first metal layer 408 is a backside (B/S) metal layer of the semiconductor package 400. The backside metal layer is configured to couple the semiconductor package 400 to one or additional circuit elements.

Figure 7:
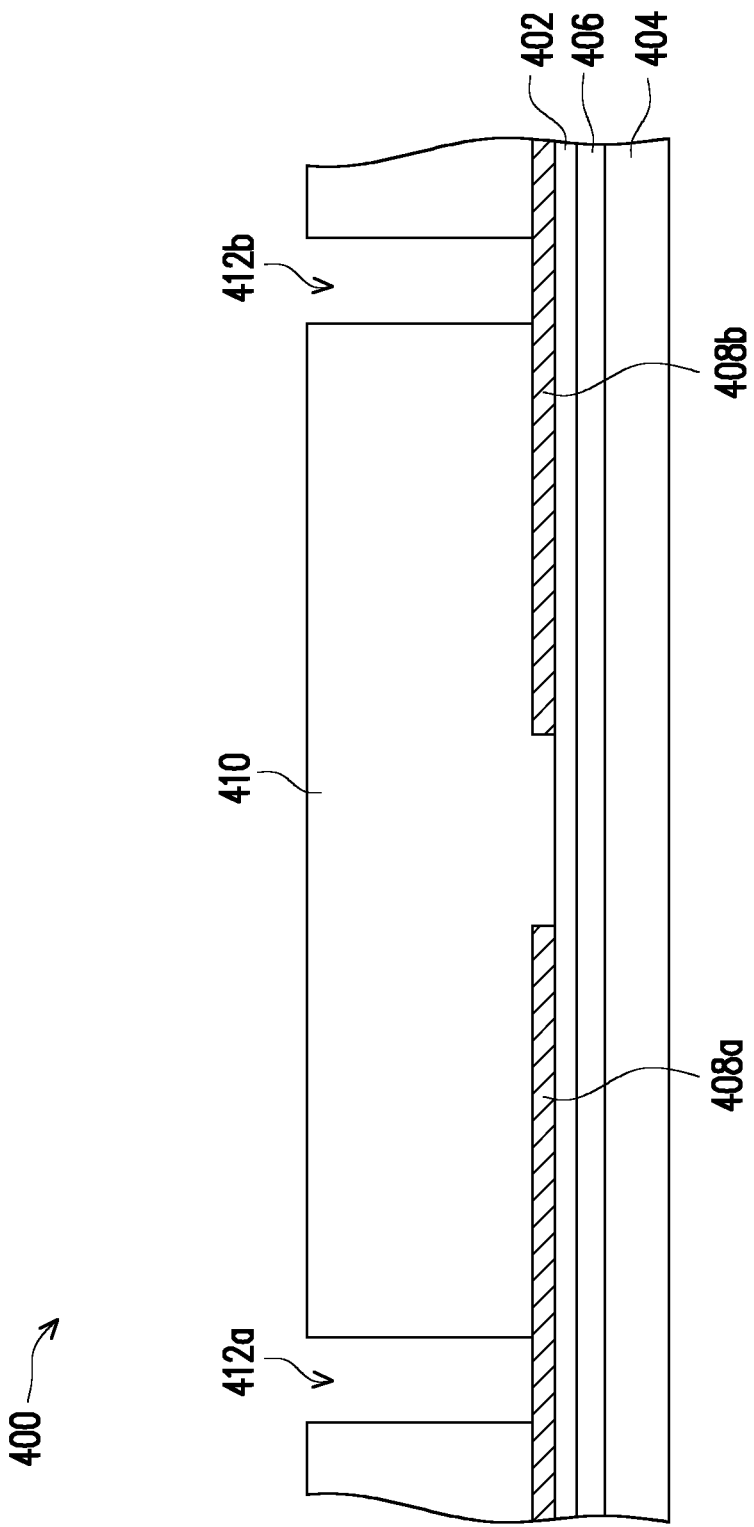
FIG. 7 illustrates the partial semiconductor package of FIG. 6 having a TIV hole photoresist patterning layer deposited thereon, in accordance with some embodiments.
Figure 8:
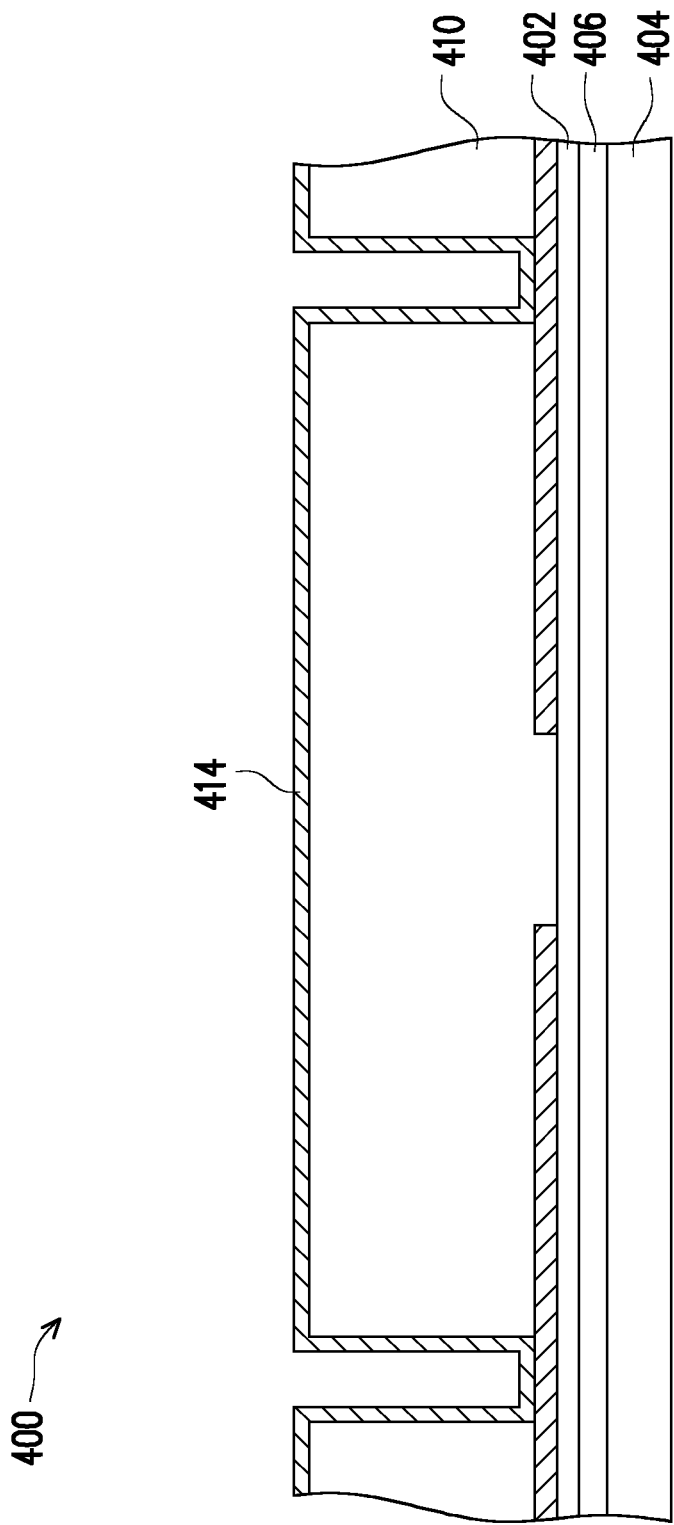
FIG. 8 illustrates the partial semiconductor package of FIG. 7 having a Ti/Cu seed layer deposited thereon, in accordance with some embodiments.

At operation 306, a TIV hole photoresist (PR) patterning layer 410 is deposited above the first metal layer 408 to define one or more TIV forming holes 412a, 412b, as shown in FIG. 7. The TIV holes 412a, 412b have a predetermined diameter and a predetermined depth (e.g., the TIV hole PR layer 410 is deposited to a predetermined height). For example, in some embodiments, the TIV holes 412a, 412b each have a diameter of about 120 microns and a depth of about 200-250 microns, although it will be appreciated that the TIV holes 412a, 412b can have a greater and/or lesser diameter and/or depth. In some embodiments, the TIV hole PR patterning layer 410 is deposited through one or more photomasks defining the TIV holes 412a, 412b.

At operation 308, a seed layer 414 is conformally deposited over the TIV hole photoresist PR layer 410. In some embodiments, such as the embodiment illustrated in FIG. 8, the seed layer 414 includes a titanium-copper (Ti-Cu) material. The seed layer 414 is deposited at a thickness sufficient to generate a predetermined conductivity. For example, in some embodiments, a Ti/Cu seed layer 414 is deposited at a predetermined thickness, such as, for example, 1000 Å thickness (Ti) and 5000 Å thickness (Cu)., although it will be appreciated that any other suitable conductivity can be selected.

Figure 9:
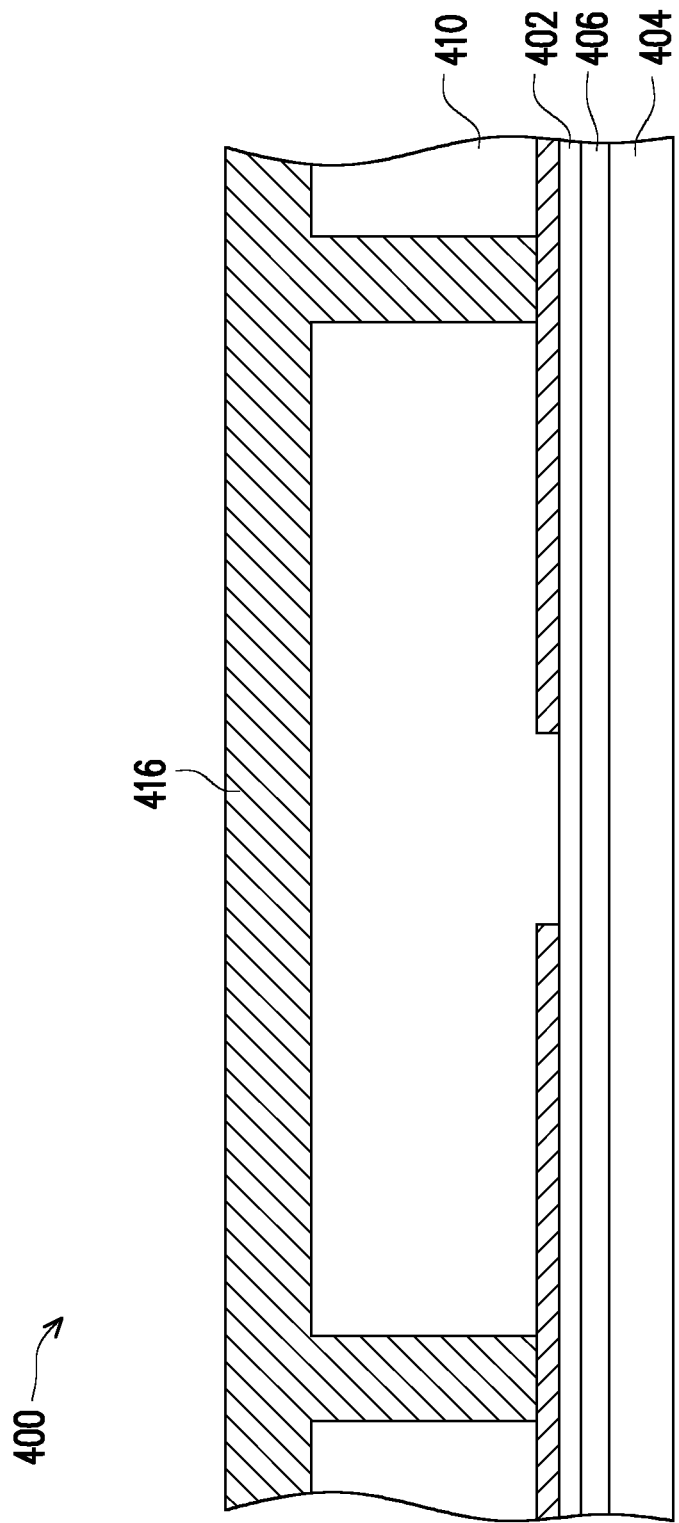
FIG. 9 illustrates the partial semiconductor package of FIG. 8 having a Cu layer deposited in one or more TIV holes, in accordance with some embodiments.

At operation 310, a conductive metal layer 416 is deposited over the seed layer 414, as shown in FIG. 9. In some embodiments, the conductive metal layer 416 is deposited using one or more electrochemical plating (ECP) processes. For example, the conductive layer 416 can be an ECP-deposited copper layer. The conductive metal layer 416 is deposited at a sufficient thickness to fill each of the TIV holes 412a, 412b previously defined. For example, in some embodiments, the conductive metal layer 416 can be deposited to a depth of about 120 microns. In some embodiments, a portion of the conductive metal layer 416 extends above the TIV holes 412a, 412b and the TIV hole PR layer 410.

Figure 10:
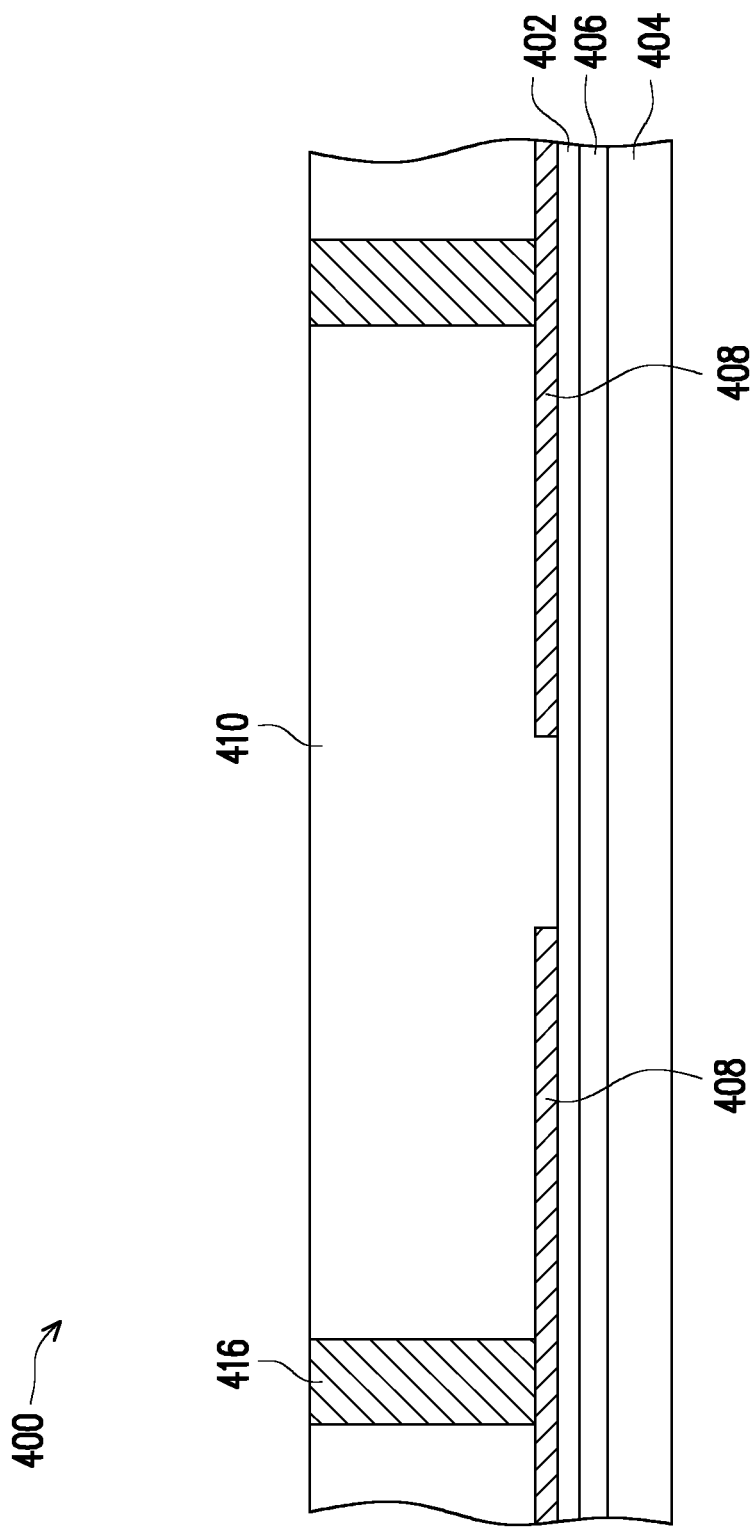
FIG. 10 illustrates the partial semiconductor package of FIG. 9 after a chemical-mechanical planarization process, in accordance with some embodiments.

At operation 312, the semiconductor package 400 is planarized to remove a portion of the conductive metal layer 416 extending above the TIV hole PR layer 410, as shown in FIG. 10. The portion of the conductive layer 416 can be removed using any suitable process, such as a chemical-mechanical planarization (CMP). In some embodiments, the semiconductor package 400 is planarized to expose the conductive material deposited within the TIV holes 412a, 412b formed in the TIV hole PR layer 410.

Figure 11:
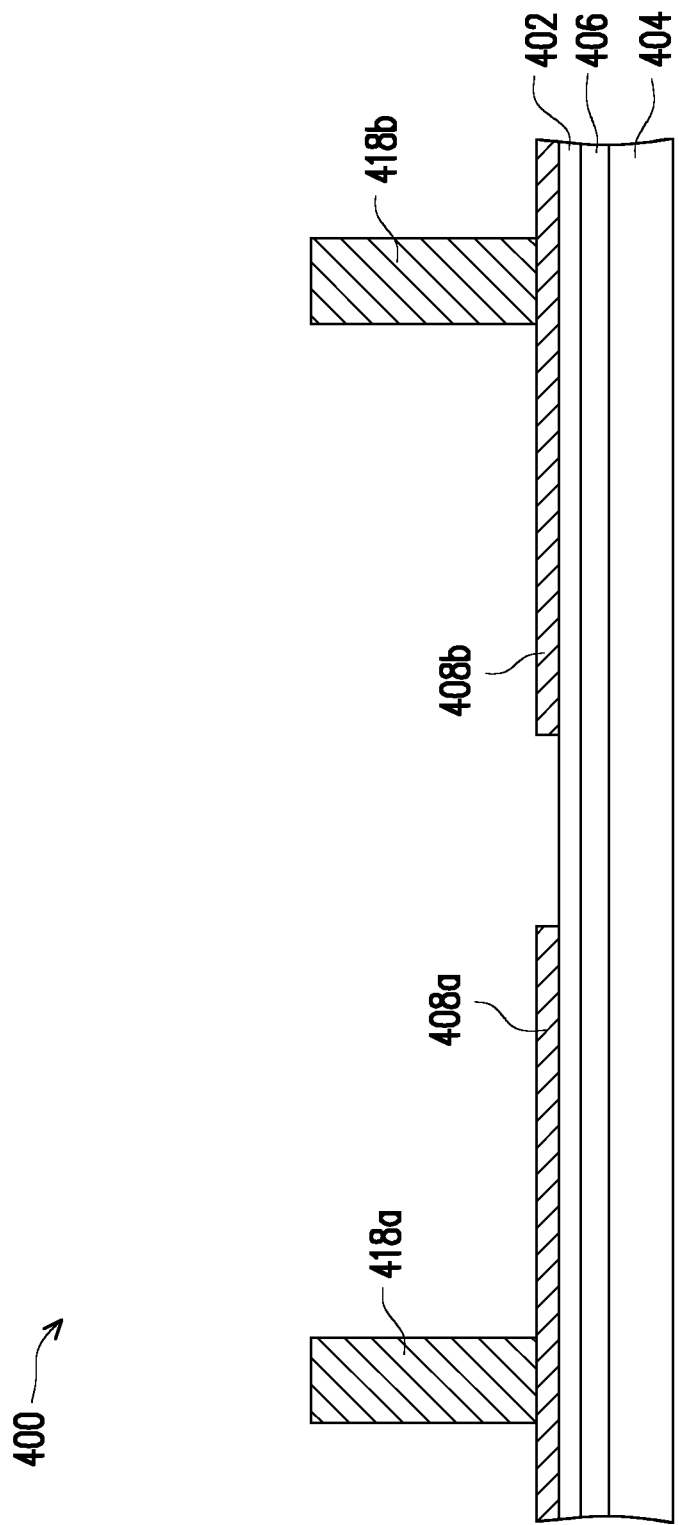
FIG. 11 illustrates the partial semiconductor package of FIG. 10 after a photoresist removal process, in accordance with some embodiments.

At operation 314, the TIV hole PR layer 410 is removed. As shown in FIG. 11, removal of the TIV hole PR layer 410 leaves a plurality of conductive columns 418a, 418b. The TIV hole PR layer 410 can be removed using any suitable process, such as, for example, an ozone plasma ashing process, a wet acid cleaning, and/or any other suitable process and/or combination thereof The conductive columns 418a, 418b extend a predetermined distance above the first buffer layer 402. For example, the conductive columns 418a, 418b can extend about 120 microns above the conductive layer 408, although it will be appreciated that the conductive columns 418a, 418b can have a greater and/or lesser height. In some embodiments, the height of the conductive columns 418a, 418b corresponds to the depth of the TIV holes 412a, 412b formed in the TIV hole PR layer 410.

Figure 12:
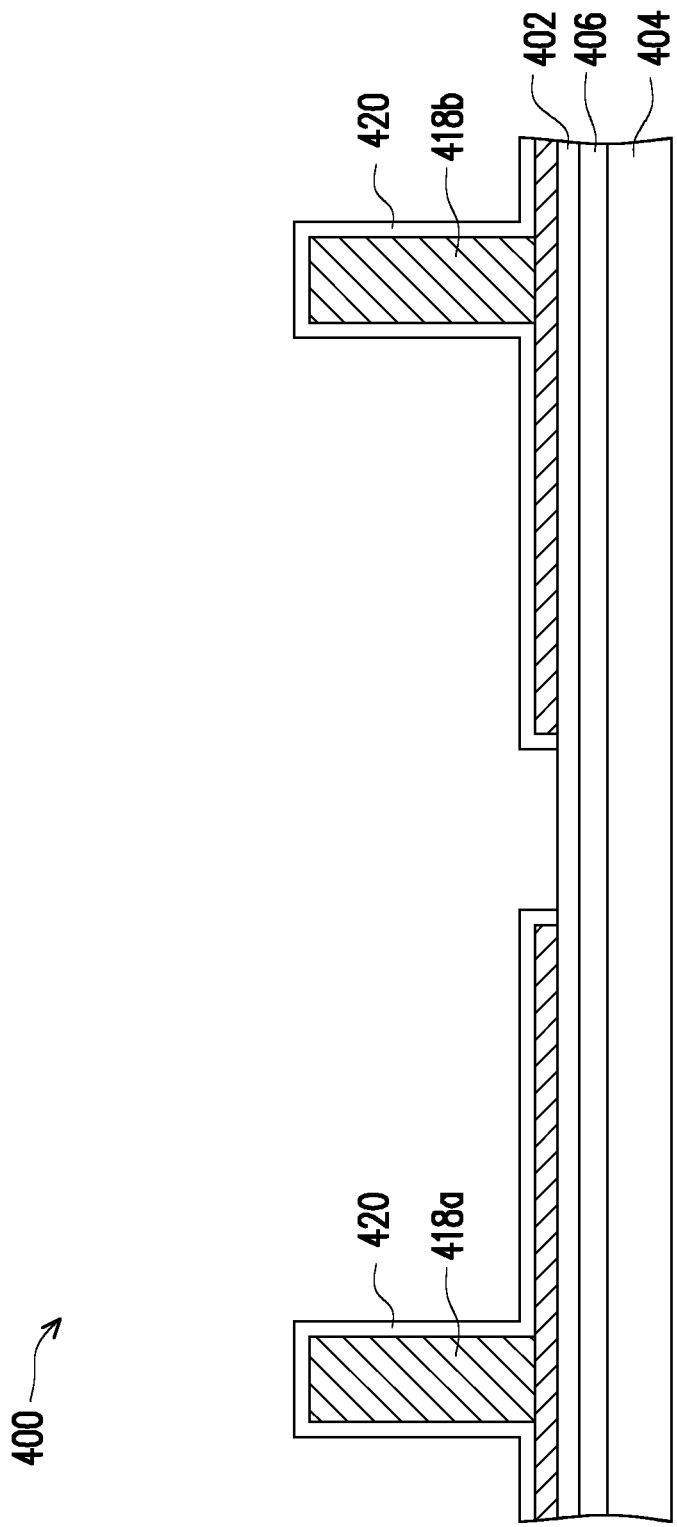
FIG. 12 illustrates the partial semiconductor package of FIG. 11 having an insulating layer deposited thereon, in accordance with some embodiments.

At operation 316, an insulating layer 420 is conformally deposited over the partial semiconductor package 300, as shown in FIG. 12. The insulating layer 420 can be any suitable high-K insulating layer 420 deposited using any suitable process. In various embodiments, the insulating layer 420 includes one or more of a ceramic material, a dielectric material, a polymer material, any other suitable material, and/or any combination thereof. For example, in some embodiments, a low temperature (e.g., 180° C.) plasma enhanced chemical vapor deposition (PECVD) dielectric is deposited. The PECVD dielectric can include, but is not limited to, a silicon-based dielectric such as $SiN_x$, $SiO_2$, $SiO_xN_y$, and/or any other suitable dielectric. In other embodiments, the insulating layer 420 is a polymer insulating material, such as Epoxy, PBO, polyimide (PI), benzocyclobutene (BCB), and/or any other suitable polymer insulating material.

Figure 13:
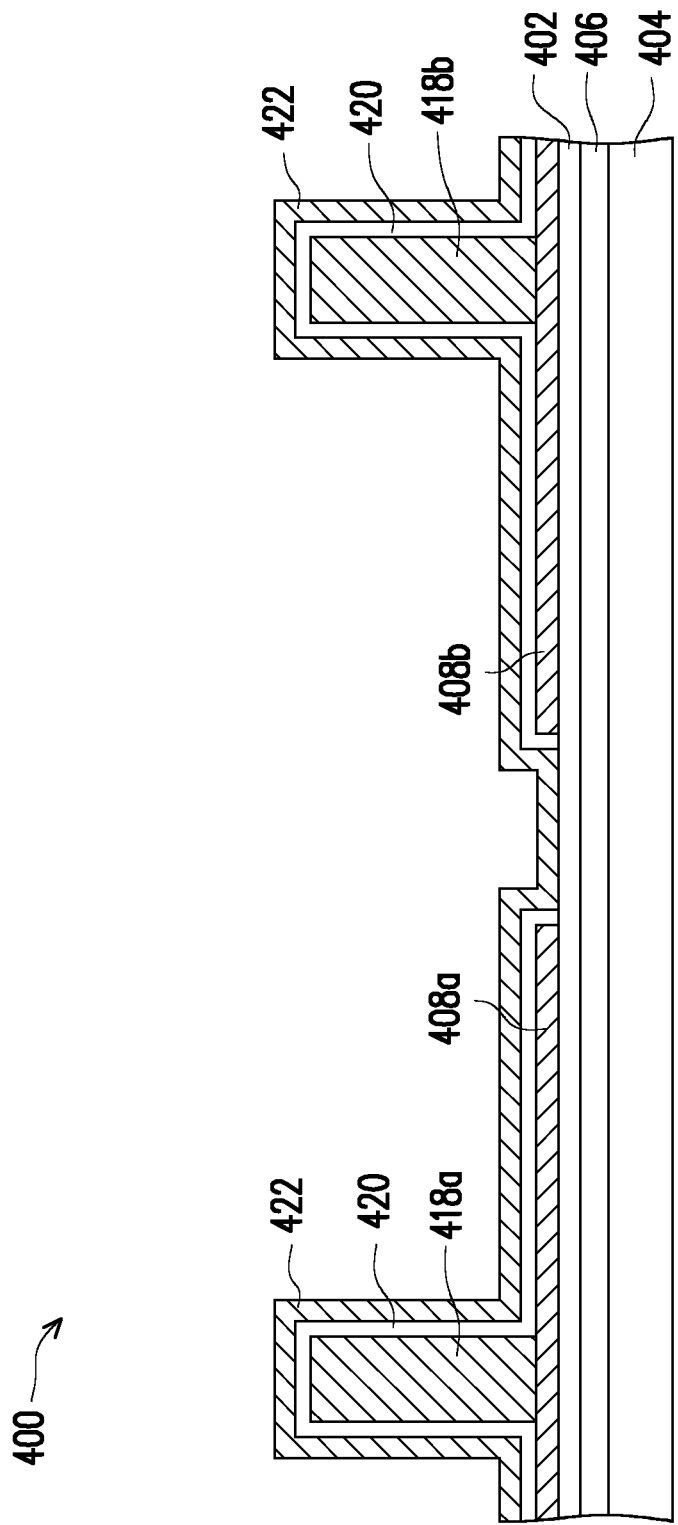
FIG. 13 illustrates the partial semiconductor package of FIG. 12 having a ground shielding layer deposited thereon, in accordance with some embodiments.

At operation 318, a coaxial ground seeding layer 422 is conformally deposited over the insulating layer 420, as shown in FIG. 13. In some embodiments, the coaxial ground seeding layer 422 can be deposited using any suitable deposition process, such as, for example, sputtering. The coaxial-ground seeding layer 422 includes a conductive material, such as copper (Cu), copper-alloy, and/or any other suitable conductive material. The coaxial ground seeding layer 420 can include any suitable material such as a material including Ti/Cu having a ⅓ KA thickness.

Figure 14:
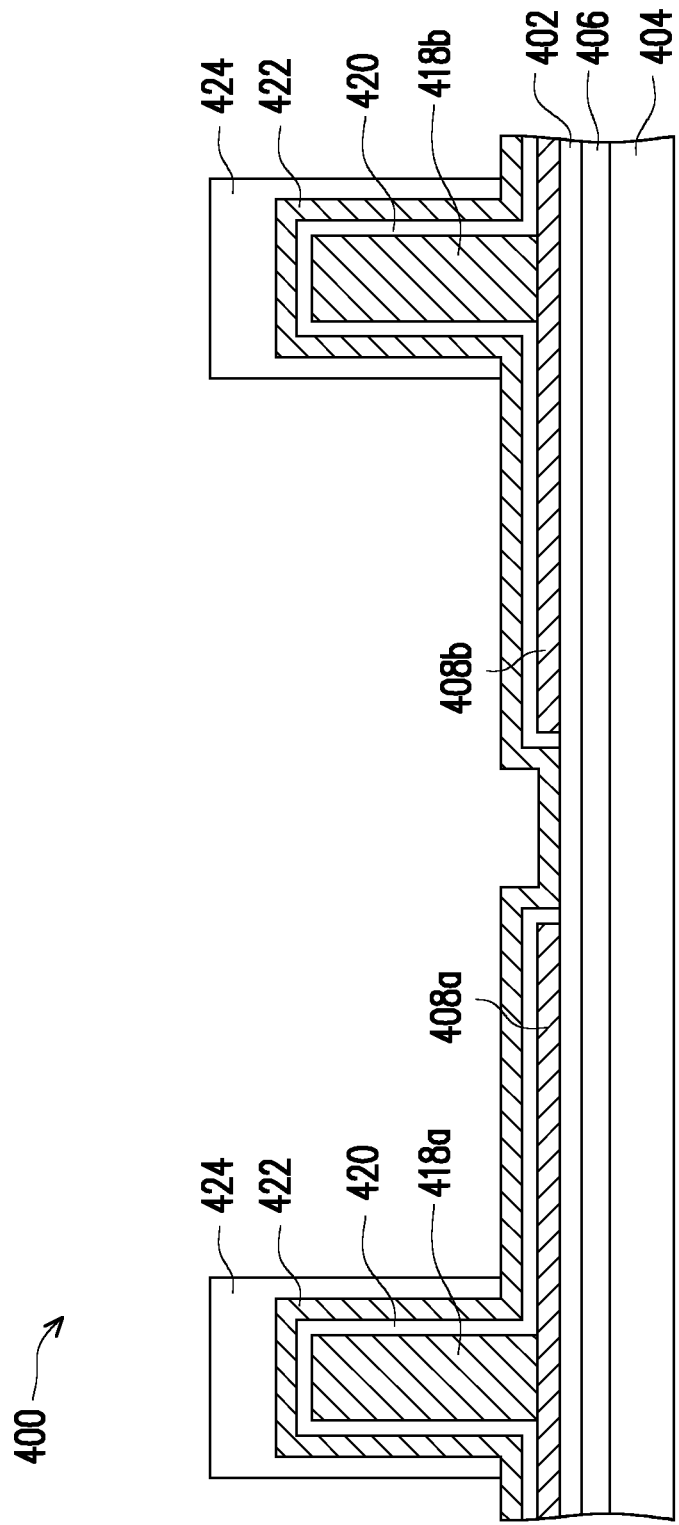
FIG. 14 illustrates the partial semiconductor package of FIG. 13 having a coaxial photoresist patterning layer deposited thereon, in accordance with some embodiments.

At operation 320, a photoresist layer 424 is deposited over a first portion of the coaxial-ground seeding layer 422, as shown in FIG. 14. The photoresist layer 424 can include any suitable photoresist material, such as a Poly(methyl methacrylate) (PMMA), Poly(methyl glutarimide) (PMGI), phenol formaldehyde resin, and/or any other suitable photoresist layer 424. The photoresist layer 424 is deposited and exposed to a light source to set or develop the photoresist material. In some embodiments, the photoresist layer 424 is deposited over portions of the coaxial ground seeding layer 424 defining a ground shielding for one or more coaxial TIVs. The photoresist layer 424 can be coated or deposited using any suitable process.

Figure 15:
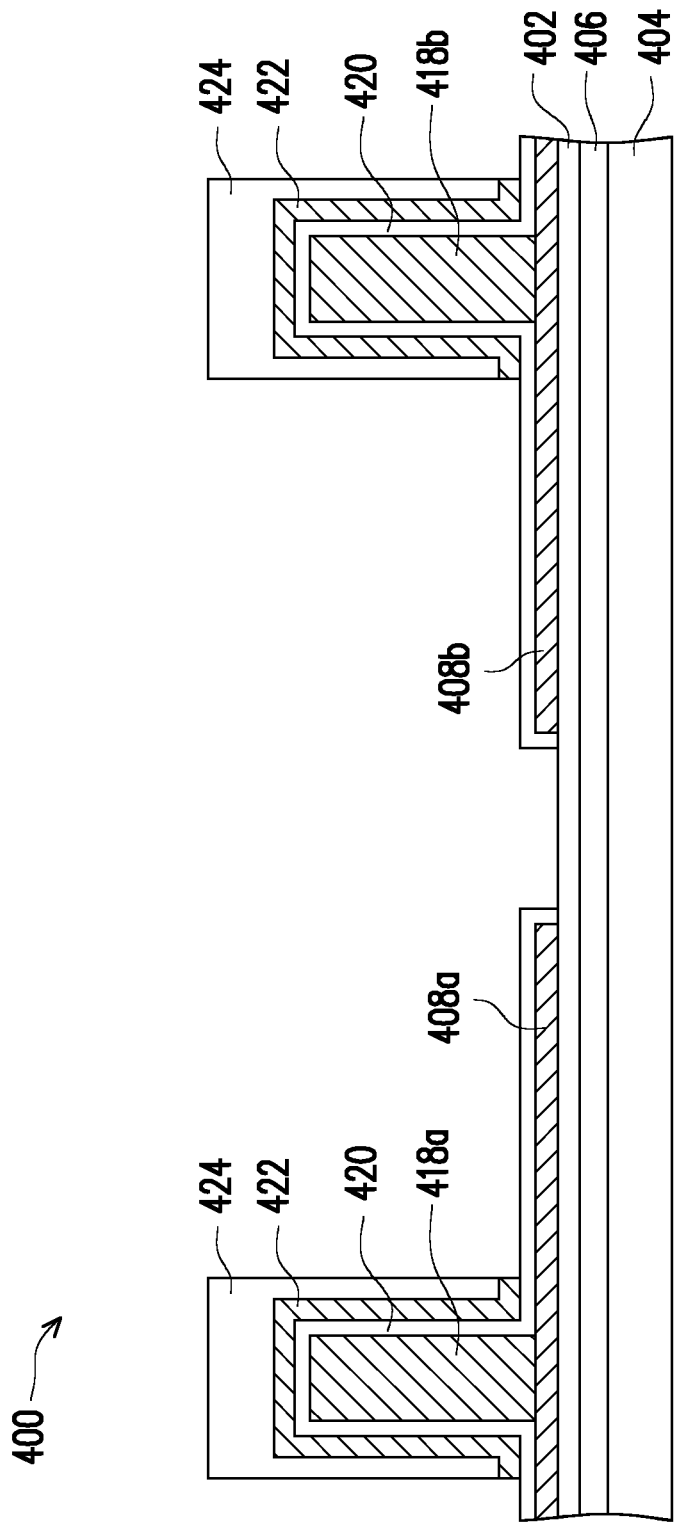
FIG. 15 illustrates the partial semiconductor package of FIG. 14 after a wet etching process, in accordance with some embodiments.

At operation 322, a second portion of the coaxial-ground seeding layer 422 not covered by the photoresist layer 424 is removed, as shown in FIG. 15. The second portion of the coaxial-ground seeding layer 422 can be removed using any suitable method, such as, for example, a wet-etchant process known in the art. The photo-resist layer 424 protects the first portion of the coaxial-ground seeding 422 during the wet etchant process.

Figure 16:
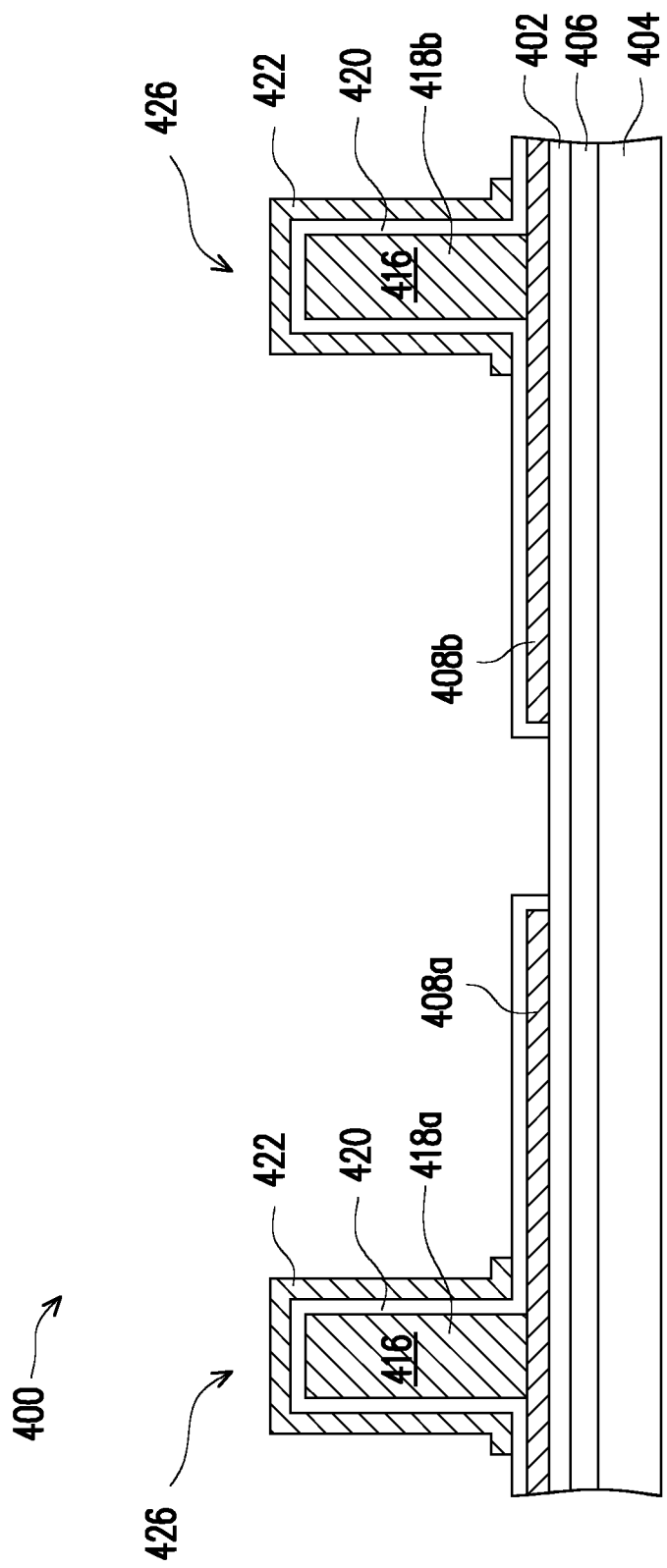
FIG. 16 illustrates the partial semiconductor package of FIG. 15 after a photoresist removal process, in accordance with some embodiments.

At operation 324, the photoresist layer 424 is removed, as shown in FIG. 16. The photoresist layer 424 can be removed using any suitable process, such as, for example, an ozone plasma ashing process, a wet acid cleaning process, and/or any other suitable process and/or combination thereof. After removing the photoresist layer 424, the partial semiconductor package 400 includes a plurality of coaxial connecters 426 having an inner conductive layer 416, an insulating layer 420, and an outer conductive layer 422. In some embodiments, the outer conductive layer 422 comprises a ground shielding layer.

Figure 17:
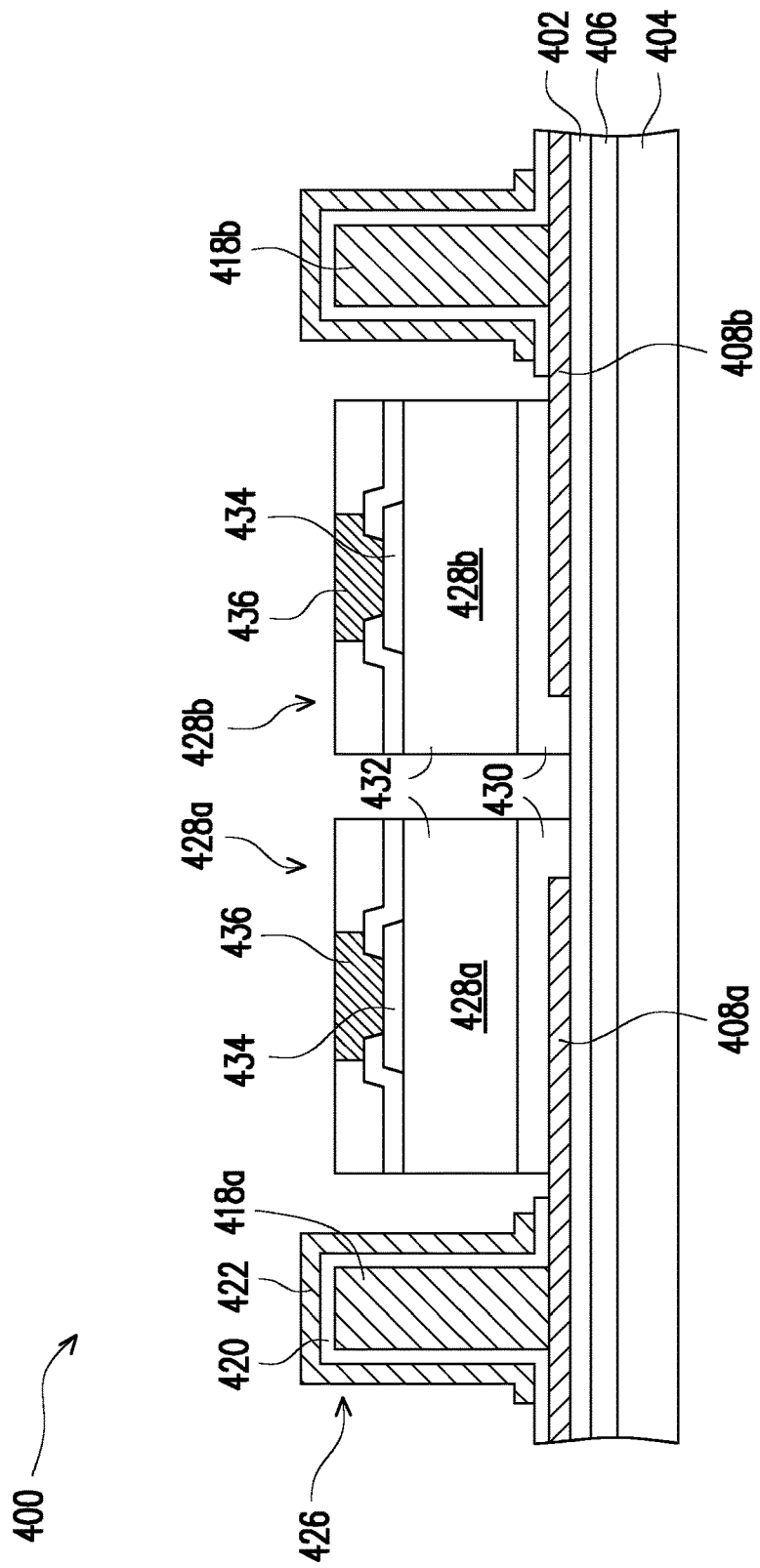
FIG. 17 illustrates the partial semiconductor package of FIG. 16 having a first semiconductor die and a second semiconductor die coupled thereto, in accordance with some embodiments.

At operation 326, a plurality of active semiconductor dies (or devices) 428a, 428b are coupled to the partial semiconductor package 400. The semiconductor dies are preformed semiconductor dies containing one or more active semiconductor elements. As shown in FIG. 17, the active semiconductor dies 428a, 428b are coupled or attached to the first metal layer 408. In some embodiments, the active semiconductor dies 428a, 428b each include a die attach film (DAF) layer 430, a silicon layer 432 including one or more active elements, an aluminum contact pad 434, and a metal via 436, although it will be appreciated that the active semiconductor dies 428a, 428b can have any suitable number and/or type of layers. In some embodiments, an upper portion of each of the semiconductor dies 428a, 428b, such as the metal via 436, is substantially parallel with the tops of the coaxial connectors 426, although it will be appreciated that the height of the semiconductor dies 428a, 428b can extend above and/or below the tops of the coaxial connectors 426.

Figure 18:
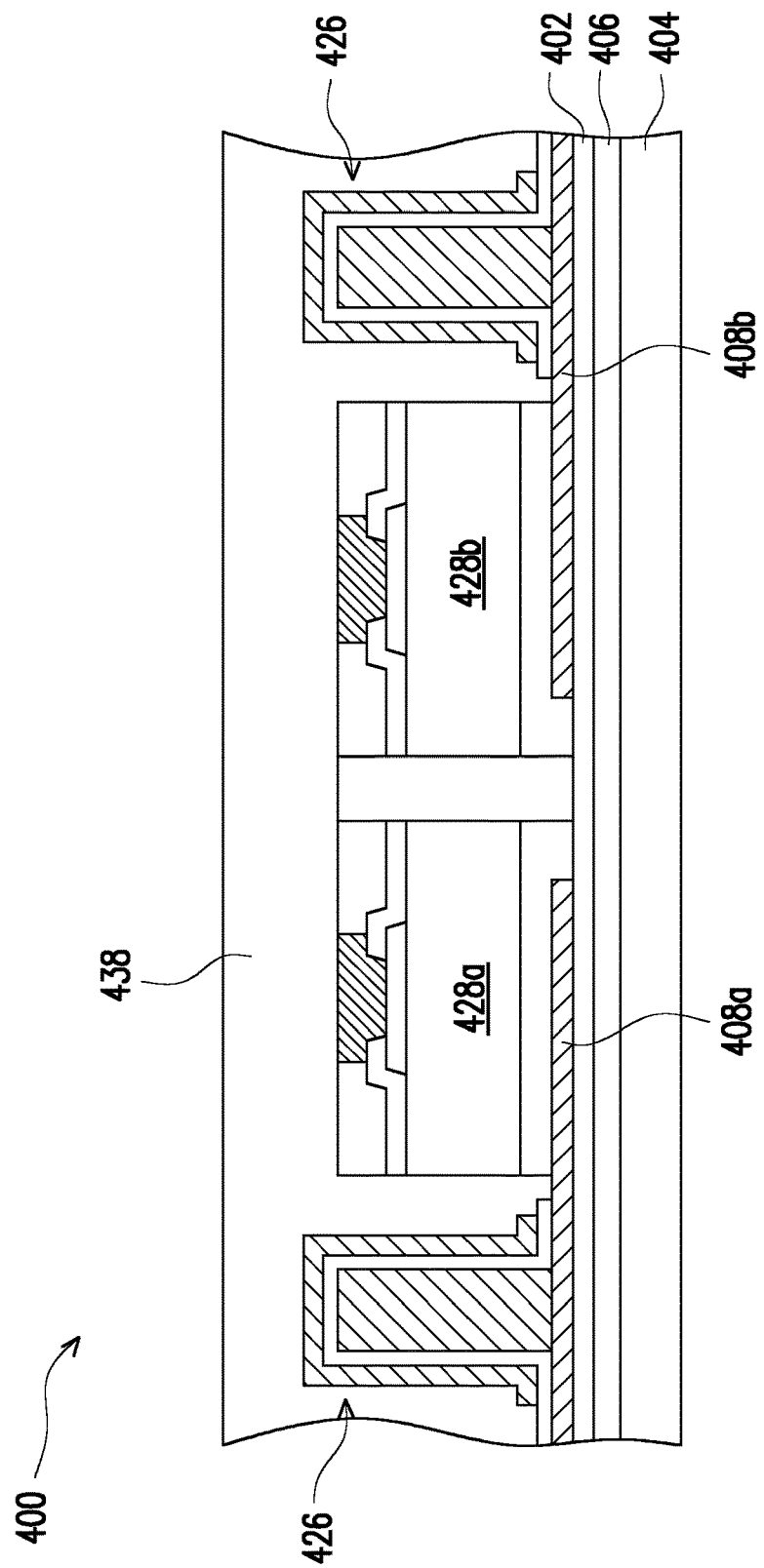
FIG. 18 illustrates the partial semiconductor package of FIG. 17 having an over molding layer deposited thereon, in accordance with some embodiments.

At operation 328, an over molding layer 438 is deposited over the partial semiconductor package 400, as shown in FIG. 18. The over molding layer 438 is configured to fill one or more gaps between the semiconductor dies 428a, 428b and the plurality of coaxial connectors 426. In some embodiments, the over molding layer 438 includes an insulating (or non-conductive) material. For example, in various embodiments, the over molding layer 438 can include an insulating material, such as a polymer material. In some embodiments, the over molding layer 438 is deposited to a depth sufficient to fill the gaps between the semiconductor dies 428a, 428b and/or the coaxial connectors 426. For example, in some embodiments, the over molding layer 438 is deposited at a thickness sufficient to extend about 50 microns above the top of the semiconductor dies 428a, 428b and/or the coaxial connectors 426.

Figure 19:
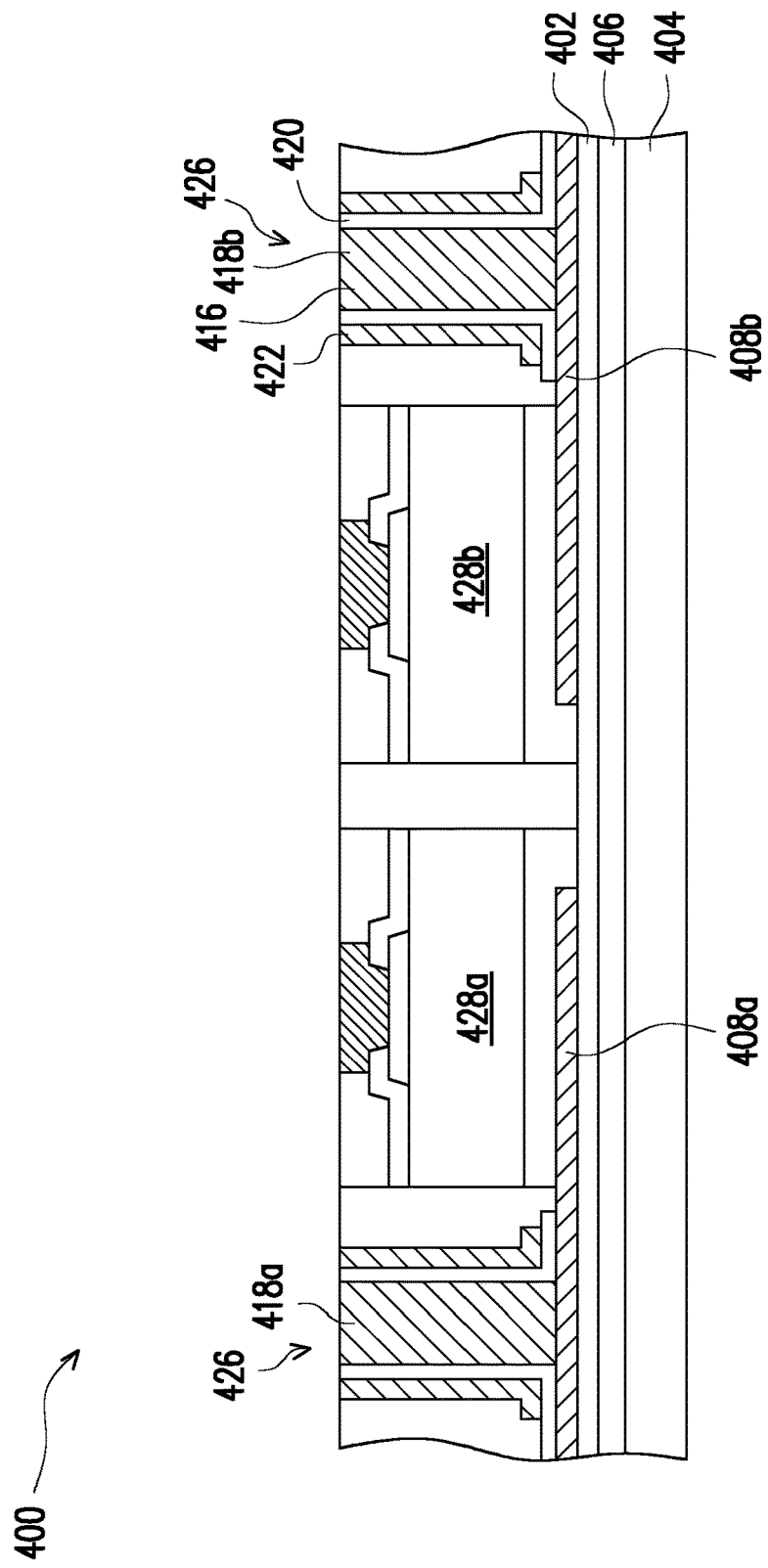
FIG. 19 illustrates the partial semiconductor package of FIG. 18 after a CMP process, in accordance with some embodiments.

At operation 330, the partial semiconductor package 400 is planarized to remove a portion of the over molding layer 438 disposed above the semiconductor dies 428a, 428b, as shown in FIG. 19. The portion of the over molding layer 438 can be removed using any suitable process, such as a grinding process followed by a CMP process and/or any other suitable process. In some embodiments, an upper portion of the insulating layer 420 and the outer conductive layer 422 of each of the coaxial connectors 426 is removed to expose an inner conductive layer 416. A portion of each of the semiconductor dies 428a, 428b, such as portion of the aluminum contact pad 434, can also be removed.

Figure 20:
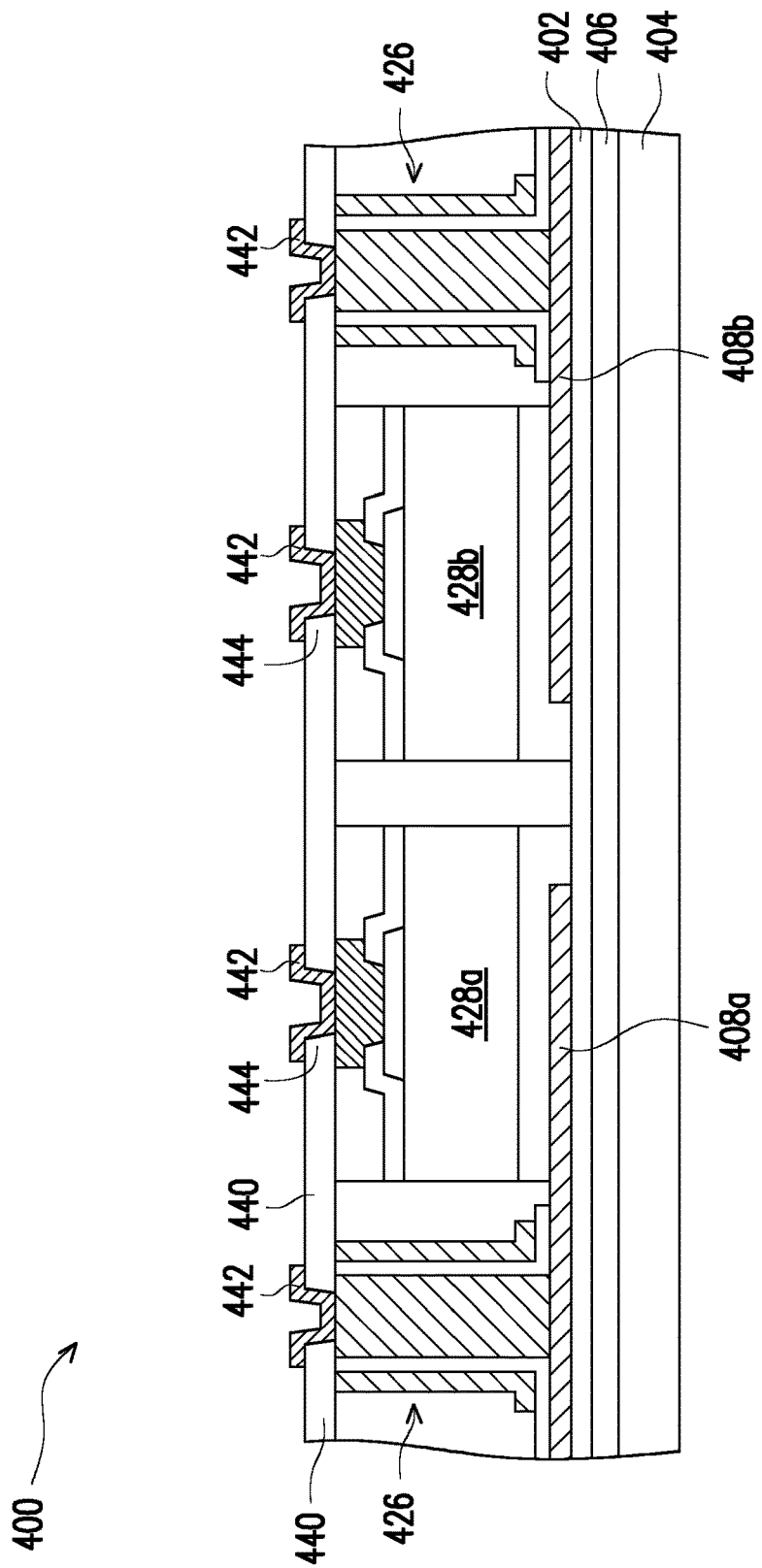
FIG. 20 illustrates the partial semiconductor package of FIG. 19 having a PBO layer deposited thereon, in accordance with some embodiments.

At operation 332, a via insulating layer 440 is deposited above the partial semiconductor package 400, as shown in FIG. 20. The via insulating layer 440 includes an insulating material configured to isolate each of the semiconductor dies 428a, 428b and the coaxial connectors 426, such as, for example, polyimide, polybenzoxazole (PBO), and/or any other suitable material. A plurality of connective vias 442 are formed in the via insulating layer 440 to provide electrical connection points for each of the semiconductor dies 428a, 428b and the coaxial connectors 426. The connective vias 442 can include any suitable conductive material, such as, for example, copper and/or a copper alloy. In some embodiments, the via insulating layer 440 includes overhangs 444 at each of the coaxial connectors 426 to isolate the inner conductive material 416 and the outer conductive ground shielding layer 422. The via insulating layer 440 can be deposited to any suitable depth, such as, for example, a depth equal to or less than about 4.5 microns, although it will be appreciated that the via insulating layer 440 can have any suitable depth greater than or less than 4.5 microns.

Figure 21:
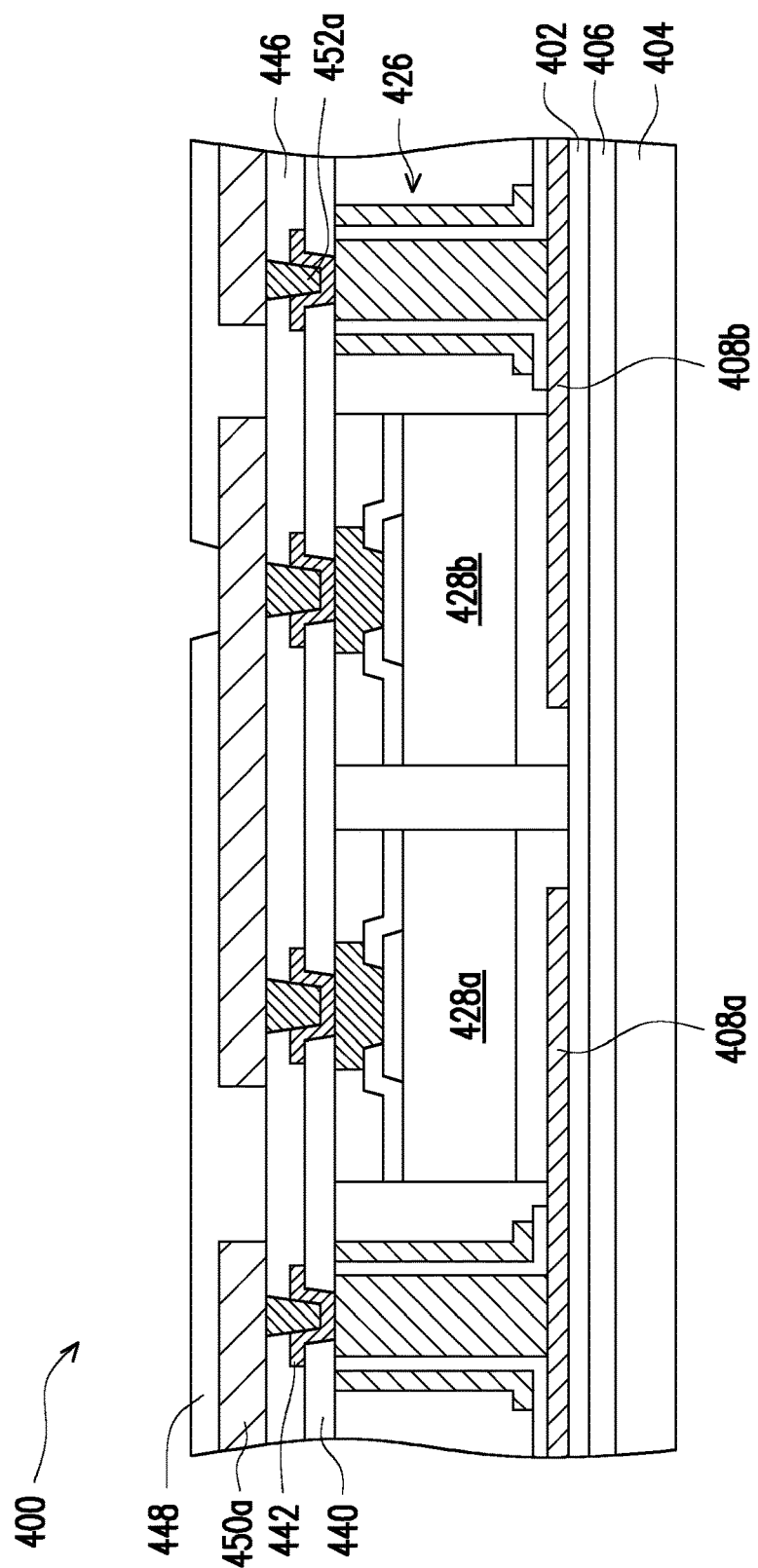
FIG. 21 illustrates the partial semiconductor package of FIG. 20 having a plurality of conductive layers and PBO layers, in accordance with some embodiments.
Figure 22:
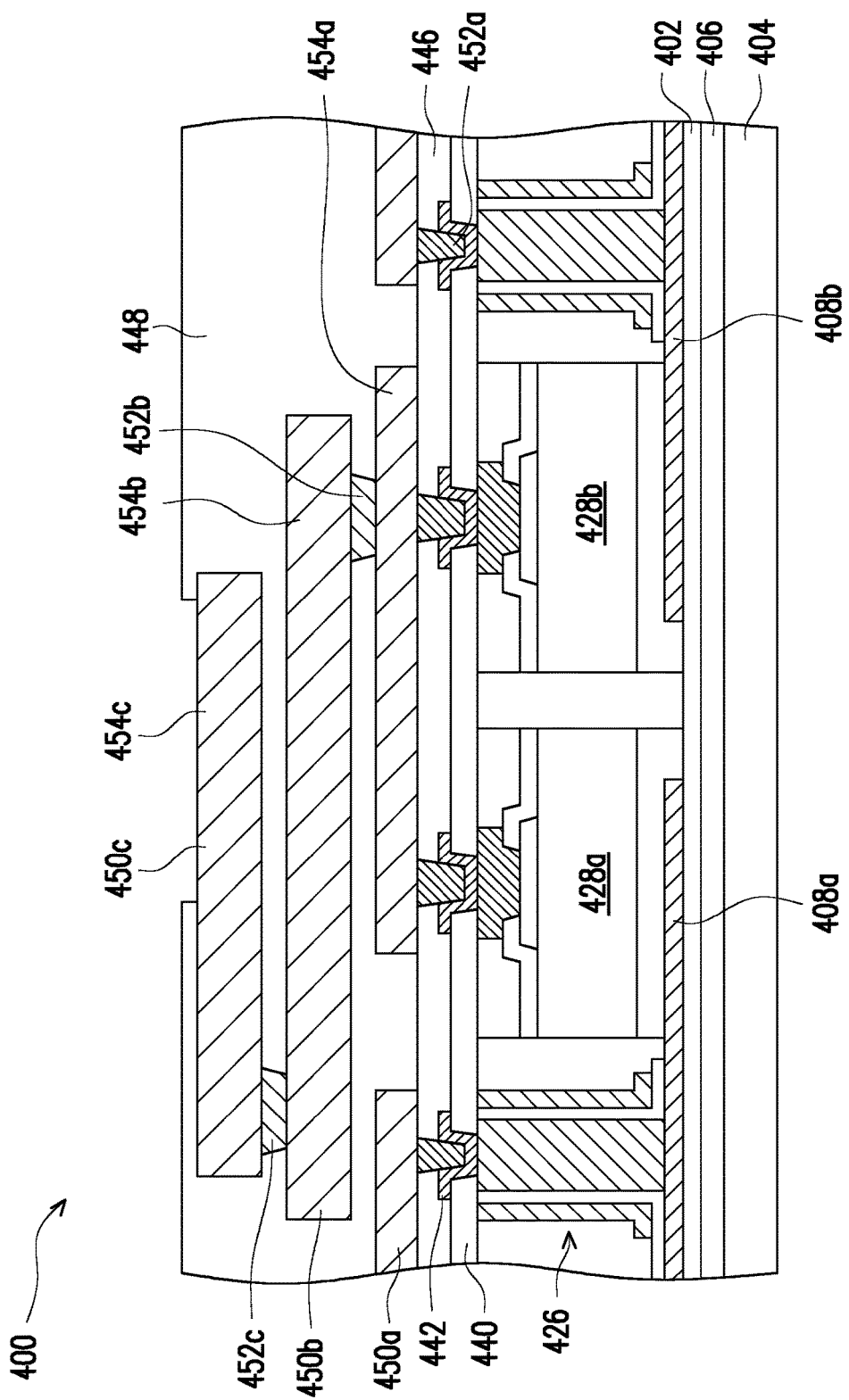
FIG. 22 illustrates the partial semiconductor package of FIG. 21 having a plurality of conductive layers and vias coupling the first and second semiconductor dies to a connection pad, in accordance with some embodiments.
Figure 23:
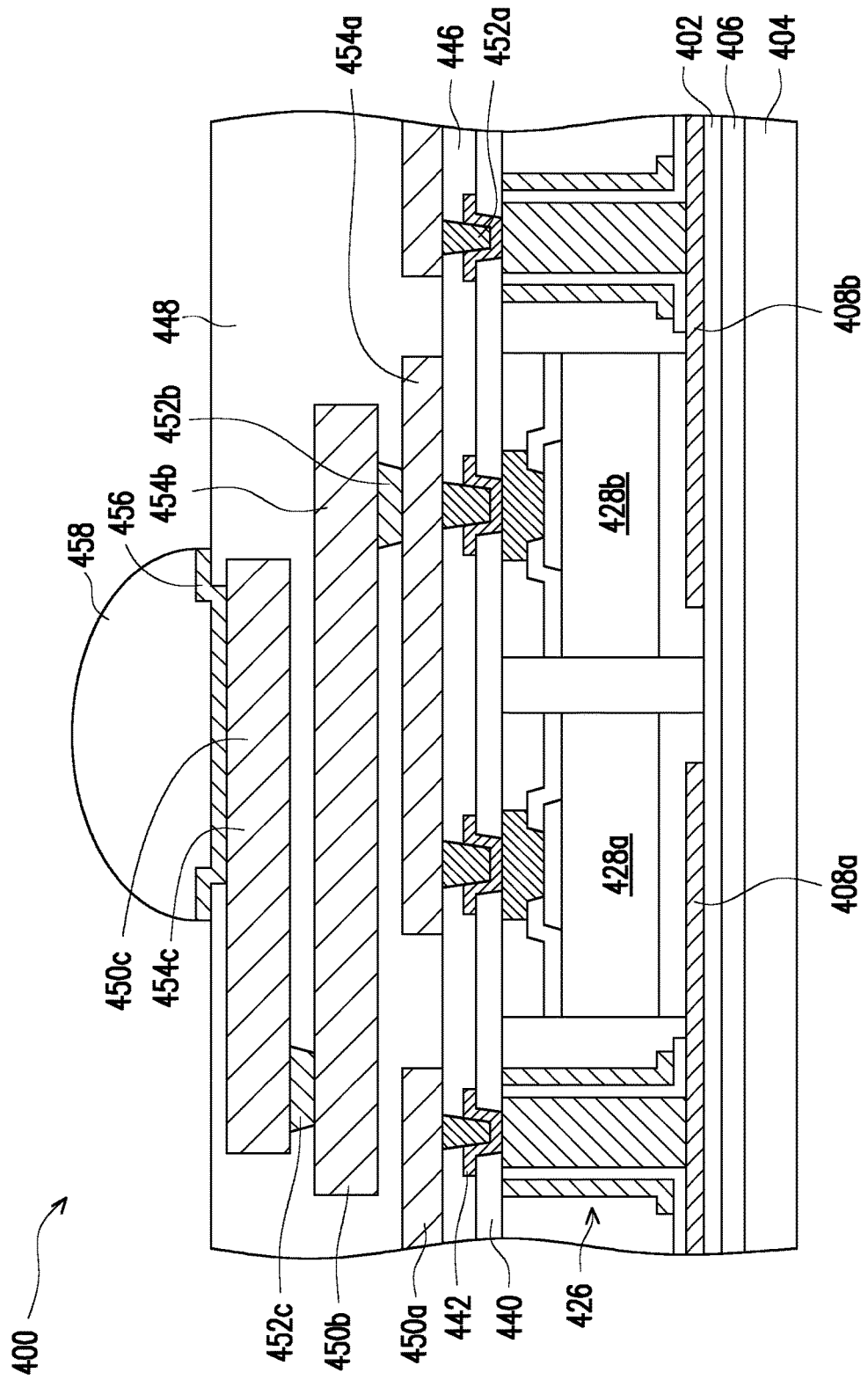
FIG. 23 illustrates the partial semiconductor package of FIG. 22 having a solder bump formed on a connection pad, in accordance with some embodiments.

At operation 334, one or more additional layers, such as one or more via layers and/or conductive layers are formed on the partial semiconductor package 400. For example, as shown in FIGS. 21 & 22, via insulating layers 446, 448 and/or conductive layer 450a-450c are formed above the first via insulating layer 440. The additional PBO layer 446 includes a plurality of vias 452a-452c coupling the coaxial connectors 426 and the semiconductor dies 428a, 428b to the conductive layer 450a. In some embodiments, the additional conductive layers, such as conductive layer 450a-450c, are configured to couple two or more elements of the semiconductor package 400 together. For example, in the embodiment illustrated in FIG. 21, the conductive layer 450a couples the first semiconductor die 428a to the second semiconductor die 428b. In some embodiments, the conductive layers 450a-450c are configured to couple one or more elements of the semiconductor package 400 to an external connection point. For example, as shown in FIG. 23, the first and second semiconductor dies 428a, 428b are coupled to a connection pad 456 by a plurality of conductive lines 454a-454c formed in a plurality of conductive layers 450a-450c. It will be appreciated that any number of via layers 446, 448 and/or conductive layers 450a-450c can be deposited on the partial semiconductor package 400.

At operation 336, as shown in FIG. 21, a solder ball 458 is formed at one or more connective points of the semiconductor package. For example, in some embodiments, a solder ball is formed on the connection pad 456. The solder ball 458 can include any suitable material, such as, for example, tin (Sn), silver (Ag), copper (Cu), lead (Pb), and/or a combination thereof.

Figure 24:
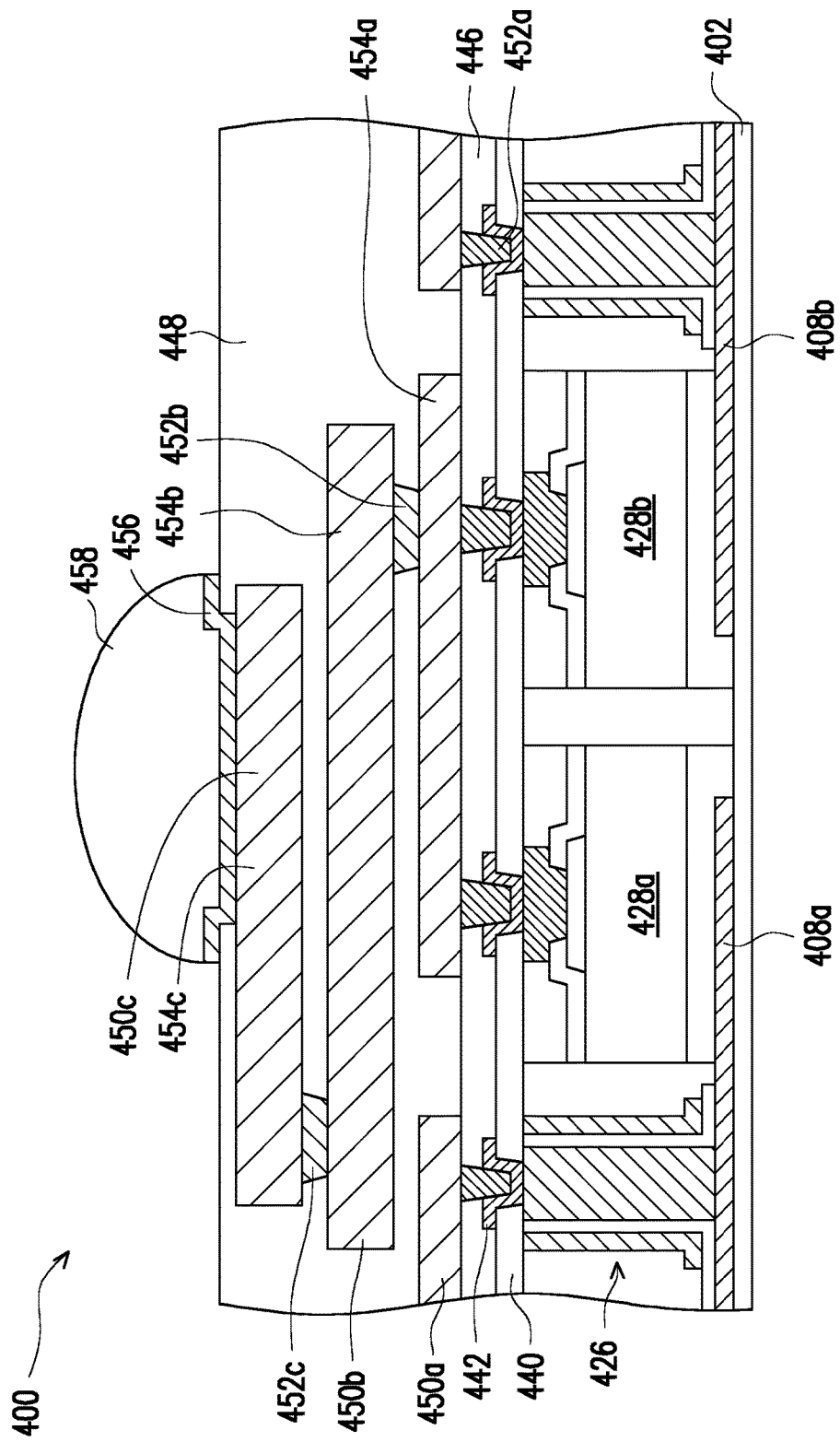
FIG. 24 illustrates the semiconductor package of FIG. 23 separated from the glass carrier, in accordance with some embodiments.

At operation 338, a light source is applied to the LTHC layer 406 to heat the LTHC layer 406, causing the semiconductor package 400 to detach from the glass carrier layer 404. The light source can be any suitable light source, such as a laser or other directed light source. FIG. 24 illustrates the completed semiconductor package 400 after being removed from the glass carrier layer 404.

In various embodiments, a semiconductor package is disclosed. The semiconductor package includes a first semiconductor element, an insulating layer, and a second semiconductor element. The first semiconductor element includes at least one conductive layer and at least one via layer. The insulating layer is positioned above the first semiconductor element and includes at least one through insulator via (TIV) extending from a first side of the insulating layer to a second side of the insulating layer. The at least one TIV has a conductive core including a copper-containing material. The second semiconductor element is positioned about the insulating layer and includes at least one conductive layer and at least one via layer. The at least one TIV couples the at least one via layer of the first semiconductor element to the at least one via layer of the second semiconductor element.

In various embodiments, a method of forming a semiconductor package is disclosed. The method includes the operations of: forming a first conductive layer on a substrate, forming an insulating layer above the first conductive layer; forming a via layer above the insulating layer; and forming a second conductive layer above the via layer. The first conductive layer includes at least one conductive trace. The insulating layer includes at least one through insulating via (TIV) extending from a first side of the insulating layer to a second side of the insulating layer. The TIV has a conductive core coupled to the at least one conductive trace of the first conductive layer. The via layer includes at least one conductive via extending from a first side to a second side of the via layer and is coupled to the at least one TIV of the insulating layer. The second conductive layer includes at least one conductive trace coupled to the at least one conductive via of the via layer.

In various embodiments, a semiconductor package is disclosed. The semiconductor package includes a first semiconductor element, an insulating layer, and a second semiconductor element. The first semiconductor element includes a first conductive layer having at least one conductive trace and a first via layer having at least one conductive via coupled to the at least one conductive trace of the first conductive layer. The insulating layer is vertically positioned above the first semiconductor device and includes an active semiconductor device, a through insulating via (TIV), and an insulating material. The TIV extends from a first side of the insulating layer to a second side of the insulating layer. The TIV includes a conductive core, an insulating layer at least partially around the conductive core, and a ground-shielding layer at least around overlapping the insulating layer. The conductive core is coupled to the at least one conductive via of the first via layer at a first end of the TIV. The conductive core and the ground-shielding layer each comprise a copper-containing material. The insulating material is positioned between the active semiconductor device and the TIV. The second semiconductor element is positioned above the insulating layer and includes a second via layer including at least one conductive via coupled to the conductive core of the TIV at a second end of the TIV and a second conductive layer including at least one conductive trace coupled to the at least one conductive via of the second via layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising,
   a first semiconductor element comprising at least one conductive layer and at least one via layer;
   an insulating layer positioned above the first semiconductor element, the insulating layer comprising at least one through insulator via (TIV) extending from a first side of the insulating layer to a second side of the insulating layer, wherein the TIV comprises a conductive core including a copper-containing material; and
   a second semiconductor element comprising at least one conductive layer and at least one via layer, wherein the second semiconductor element is positioned above the insulating layer, and
   wherein the at least one TIV couples the at least one via layer of the first semiconductor element to the at least one via layer of the second semiconductor element, wherein the at least one TIV comprises a first insulating layer disposed around the conductive core and a ground shielding layer disposed around the first insulating layer.

2. The semiconductor package of claim 1, wherein the ground shielding layer comprises a copper-containing material.

3. The semiconductor package of claim 1, wherein the insulating layer comprises a low temperature plasma enhanced chemical vapor deposition (PECVD) dielectric.

4. The semiconductor package of claim 3, wherein PECVD dielectric comprises a silicon-based dielectric.

5. The semiconductor package of claim 1, comprising a second insulating layer disposed around the ground shielding layer.

6. The semiconductor package of claim 5, wherein the second insulating layer comprises a polymer insulating material selected from the group consisting of polybenzoxazole (PBO), polyimide (PI), and benzocyclobutene (BCB).

7. The semiconductor package of claim 1, wherein the copper-containing material comprises a titanium/copper (Ti/Cu) material.

8. The semiconductor package of claim 1, wherein the insulating layer comprises an interposer including one or more active semiconductor devices.

9. A method of forming the semiconductor package of claim 1, comprising:
   forming a first conductive layer on a substrate, wherein the first conductive layer comprises at least one conductive trace;
   forming an insulating layer above the first conductive layer, wherein the insulating layer includes at least one through insulating via (TIV) extending from a first side of the insulating layer to a second side of the insulating layer, and wherein the TIV comprises a conductive core coupled to the at least one conductive trace of the first conductive layer;
   forming a via layer above the insulating layer, wherein the via layer comprises at least one conductive via extending from a first side to a second side of the via layer, and wherein the at least one conductive via is coupled to the at least one TIV of the insulating layer; and
   forming a second conductive layer above the via layer, wherein the second conductive layer comprises at least one conductive trace coupled to the at least one conductive via of the via layer.

10. The method of claim 9, wherein forming the insulating layer comprises:
    depositing a TIV hole photoresist layer over the first via layer, wherein the TIV hole photoresist layer defines at least one TIV hole positioned at least partially above the at least one conductive via of the first via layer;
    depositing a first conductive copper-containing material over the TIV hole photoresist layer, wherein the first conductive copper-containing material is deposited to a depth sufficient to fill the at least one TIV hole; and
    removing the TIV hole photoresist layer such that a column of the first conductive copper-containing material defines a conductive core of the at least one TIV.

11. The method of claim 10, wherein forming the insulating layer further comprises:
    depositing a first insulating layer over the column of the first conductive copper-containing material; and
    depositing a second conductive copper-containing material over the first insulating layer, wherein the column of the first conductive copper-containing material, the first insulating layer, and the second conductive copper-containing material define the at least one TIV.

12. The method of claim 11, wherein depositing the first insulating layer comprises depositing a low temperature plasma enhanced chemical vapor deposition (PECVD) dielectric material.

13. The method of claim 11, wherein forming the insulating layer comprises performing a planarizing operation to expose the conductive core.

14. The method of claim 11, comprising forming a second insulating layer over the at least one TIV.

15. The method of claim 14, wherein the second insulating layer comprises a material selected from the group consisting of polybenzoxazole (PBO), polyimide (PI), and benzocyclobutene (BCB).

16. The method of claim 9, comprising coupling at least one active semiconductor die to the insulating layer.

17. The method of claim 9, comprising:
    forming a connection pad above the second conductive layer, wherein the connection pad is coupled to the at least one conducive trace formed in the second conductive layer; and
    forming a solder ball over the connection pad.

18. A semiconductor package, comprising:
    a first semiconductor element comprising:
       a first conductive layer including at least one conductive trace; and
       a first via layer including at least one conductive via coupled to the at least one conductive trace of the first conductive layer;
    an insulating layer positioned above the first semiconductor element, the insulating layer comprising:
       an active semiconductor device;
       a through insulating via (TIV) extending from a first side of the insulating layer to a second side of the insulating layer, wherein the TIV comprises a conductive core, an insulating layer at least partially around the conductive core, and a ground-shielding layer at least partially around the insulating layer, wherein the conductive core is coupled to the at least one conductive via of the first via layer at a first end of the TIV, wherein the conductive core and the ground-shielding layer each comprise a copper-including material; and
       an insulating material positioned between the active semiconductor device and the TIV; and
    a second semiconductor element positioned above the insulating layer, the second semiconductor element comprising:
       a second via layer including at least one conductive via coupled to the conductive core of the TIV at a second end of the TIV; and
       a second conductive layer including at least one conductive trace coupled to the at least one conductive via of the second via layer.

19. The semiconductor package of claim 18, wherein the first copper containing material is a titanium-copper material.

* * * * *